United States Patent
Park

(10) Patent No.: US 12,063,825 B2
(45) Date of Patent: Aug. 13, 2024

(54) TRANSPARENT DISPLAY DEVICE

(71) Applicant: LG Display Co., Ltd., Seoul (KR)

(72) Inventor: JaeHee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 322 days.

(21) Appl. No.: 17/370,811

(22) Filed: Jul. 8, 2021

(65) Prior Publication Data

US 2022/0028957 A1 Jan. 27, 2022

(30) Foreign Application Priority Data

Jul. 23, 2020 (KR) .......................... 10-2020-0091760

(51) Int. Cl.
*H10K 59/131* (2023.01)
*H10K 50/86* (2023.01)
*H10K 59/35* (2023.01)

(52) U.S. Cl.
CPC ......... *H10K 59/131* (2023.02); *H10K 50/865* (2023.02); *H10K 59/351* (2023.02); *H10K 59/352* (2023.02); *H10K 59/353* (2023.02)

(58) Field of Classification Search
None
See application file for complete search history.

(56) References Cited

U.S. PATENT DOCUMENTS

| | | | | |
|---|---|---|---|---|
| 2010/0013853 | A1* | 1/2010 | Takatori | H05B 47/16 345/611 |
| 2015/0009104 | A1* | 1/2015 | Kim | G09G 3/3225 345/76 |
| 2016/0315133 | A1* | 10/2016 | Sato | H10K 50/818 |
| 2017/0053624 | A1* | 2/2017 | Hayashi | G09G 5/391 |
| 2017/0250240 | A1* | 8/2017 | Lee | H10K 59/131 |
| 2020/0152126 | A1* | 5/2020 | Jo | H10K 59/351 |

* cited by examiner

*Primary Examiner* — Erik T. K. Peterson
*Assistant Examiner* — Christopher A. Schodde
(74) *Attorney, Agent, or Firm* — Seed IP Law Group LLP

(57) ABSTRACT

A transparent display device may improve transmittance and definition. The transparent display device comprises a plurality of first signal lines extended in a first direction and disposed to be spaced apart from one another, a plurality of second signal lines extended in a second direction and disposed to be spaced apart from one another, a transmissive area provided between two first signal lines adjacent to each other and two second signal lines adjacent to each other, and a first pixel and a second pixel disposed based on an overlapping area where the first signal line and the second signal line cross each other. The first pixel has a triangular shape, and the second pixel has a triangular shape symmetrical with the first pixel by interposing one of the first signal line and the second signal line.

24 Claims, 11 Drawing Sheets

TRANSPARENT DISPLAY DEVICE

CROSS-REFERENCE TO RELATED APPLICATIONS

This application claims the benefit of the Korean Patent Application No. 10-2020-0091760 filed on Jul. 23, 2020, which are hereby incorporated by reference as if fully set forth herein.

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit external light, and a non-transmissive area. The transparent display device may have high light transmittance in the display area through the transmissive area. The transparent display device includes a black matrix between subpixels to avoid color mixture.

BRIEF SUMMARY

The inventors of the present disclosure have recognized that although a black matrix is placed between subpixels to avoid color mixture, the black matrix causes deterioration of transmittance. The present disclosure has been made in view of the above problems as well as other problems in the related art, and one or more embodiments of the present disclosure provide a transparent display device that may reduce or minimize loss of light transmittance, which is caused by a black matrix.

One or more embodiments of the present disclosure to provide a transparent display device that may increase a size of a transmissive area.

One or more embodiments of the present disclosure to provide a transparent display device that may improve definition of picture quality.

One or more embodiments of the present disclosure to provide a transparent display device that may improve definition of an object or image disposed on a rear surface.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a transparent display device comprising a plurality of first signal lines extended in a first direction and disposed to be spaced apart from one another, a plurality of second signal lines extended in a second direction and disposed to be spaced apart from one another, a transmissive area provided between two first signal lines adjacent to each other and two second signal lines adjacent to each other, and a first pixel and a second pixel disposed based on an overlapping area where the first signal line and the second signal line cross each other, wherein the first pixel has a triangular shape, and the second pixel has a triangular shape symmetrical with the first pixel by interposing one of the first signal line and the second signal line.

In accordance with another aspect of the present disclosure, the above and other benefits can be accomplished by the provision of a transparent display device comprising a plurality of first signal lines extended in a first direction and disposed to be spaced apart from one another, a plurality of second signal lines extended in a second direction and disposed to be spaced apart from one another, a transmissive area provided between two first signal lines adjacent to each other and two second signal lines adjacent to each other, and a first pixel and a second pixel disposed based on an overlapping area where the first signal line and the second signal line cross each other, and disposed to be symmetrical with each other by interposing a second signal line. Each of the first pixel and the second pixel includes four subpixels.

BRIEF DESCRIPTION OF THE SEVERAL VIEWS OF THE DRAWINGS

The above and other benefits, features and other advantages of the present disclosure will be more clearly understood from the following detailed description taken in conjunction with the accompanying drawings, in which.

DETAILED DESCRIPTION

Figure 1:
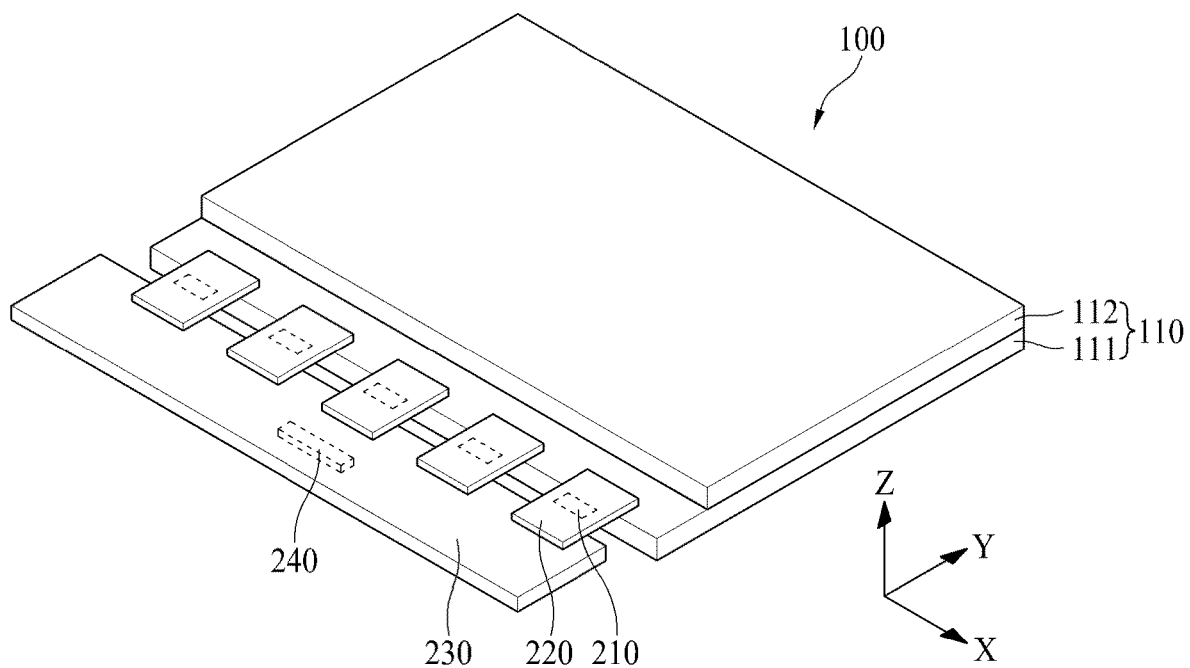
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

Figure 2:
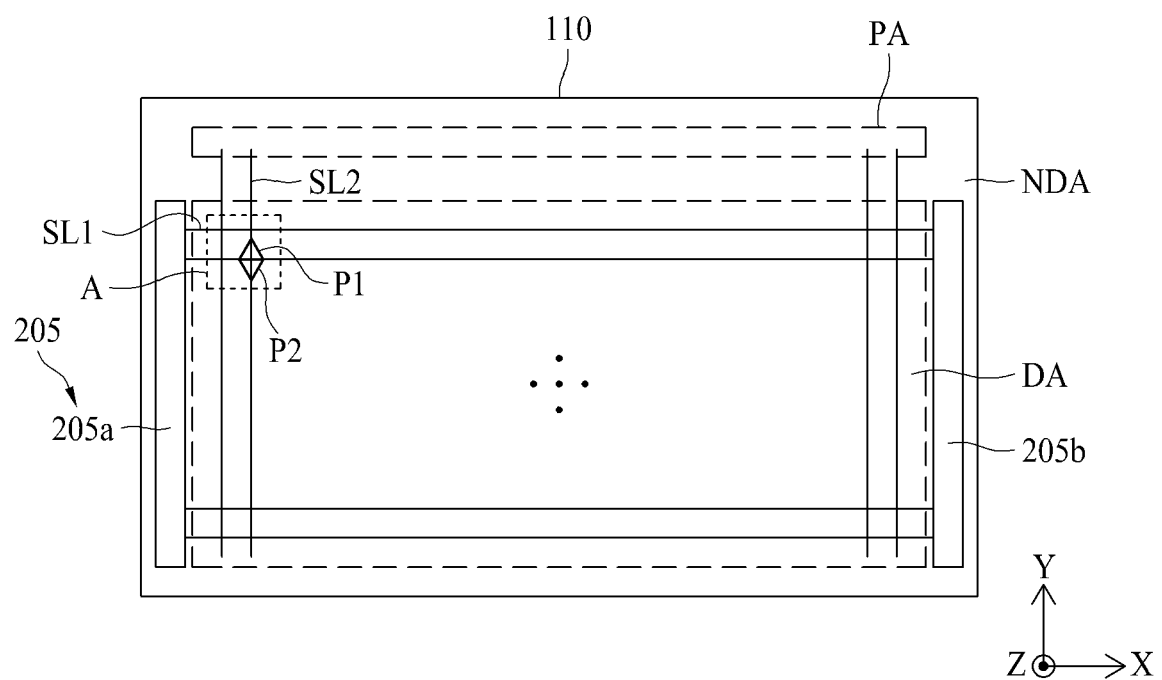
FIG. 2 is a schematic plane view illustrating a transparent display panel.

FIG. 1 is a perspective view illustrating a transparent display device according to one embodiment of the present disclosure, and FIG. 2 is a schematic plane view illustrating a transparent display panel.

Hereinafter, X axis indicates a line parallel with a gate line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1 and FIG. 2, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The transparent display panel 110 may include a display area DA where pixels P are formed to display an image, and a non-display area NDA that does not display an image.

The display area DA may be provided with first signal lines SL1, second signal lines SL2 and pixels P, and the non-display area NDA may be provided with a pad area PA for pads and a gate driver 205.

The first signal lines SL1 may be extended in a first direction (e.g., X axis direction), and may cross the second signal lines SL2 in the display area DA. The second signal lines SL2 may be extended in a second direction (e.g., Y axis direction). The pixels P may be provided in an area where the first signal lines SL1 and the second signal lines SL2 overlap, and emit predetermined or selected light to display an image.

The gate driver 205 supplies gate signals to the gate lines in accordance with a gate control signal which is provided from the timing controller 240. The gate driver 205 may be provided in one side of the display area of the transparent display panel 110, or the non-display area of both peripheral sides of the transparent display panel 110 by a gate driver in panel (GIP) method. In another way, the gate driver 205 may be manufactured in a driving chip, may be mounted on the flexible film, and may be attached to one peripheral side or both peripheral sides of the display area of the transparent display panel 110 by a tape automated bonding (TAB) method.

For example, the gate driver 205, as shown in FIG. 2, may include a first gate driver 205a provided in the non-display area NDA disposed over a first peripheral side of the display area DA, and a second gate driver 205b provided in the non-display area NDA disposed over a second peripheral side of the display area DA, but is not limited thereto.

If the source drive IC 210 is manufactured in a driving chip, the source drive IC 140 may be mounted on the flexible film 220 by a chip on film (COF) method or a chip on plastic (COP) method.

Pads, such as power pads and data pads, may be provided in the pad area PA of the transparent display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 3:
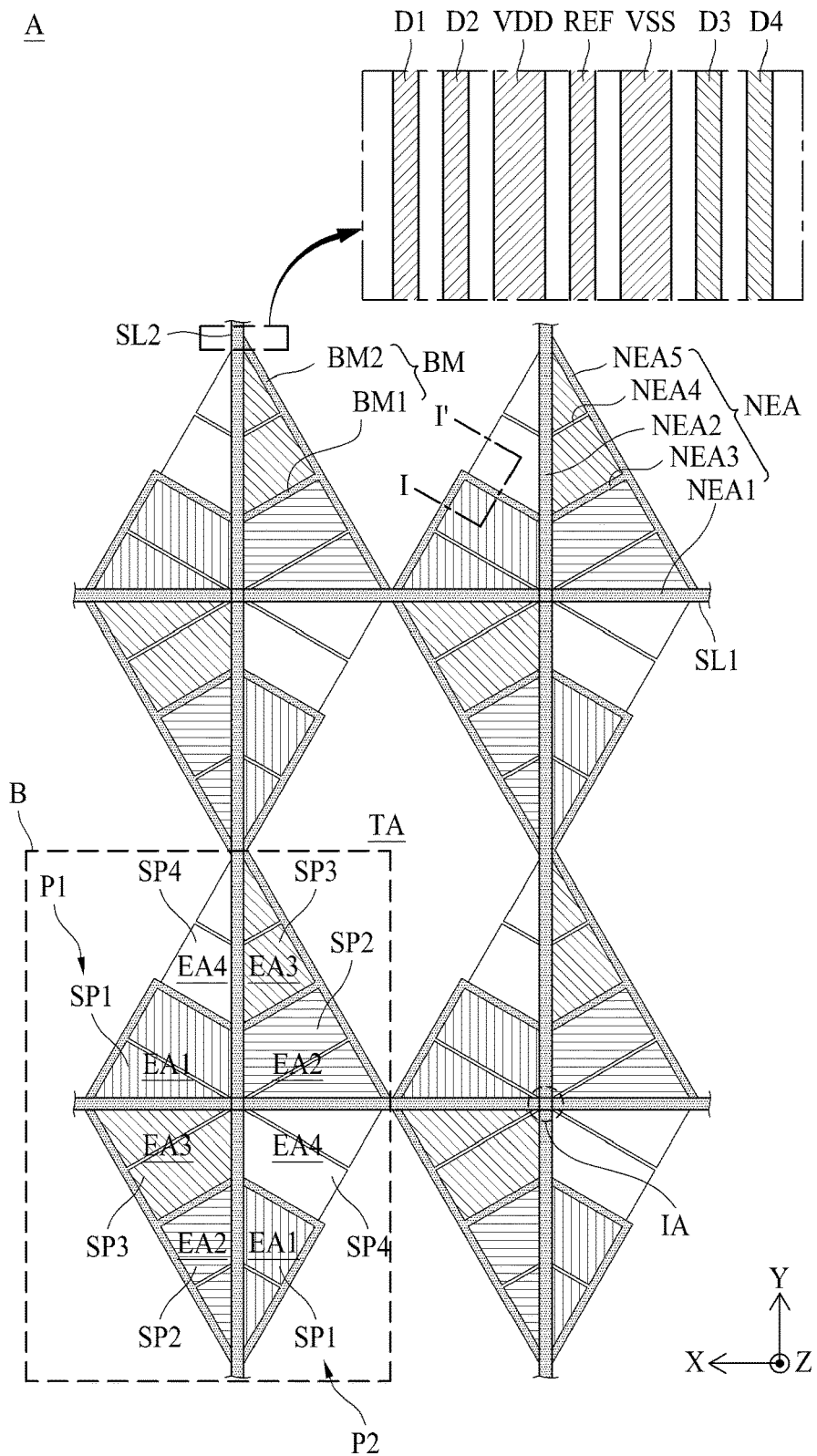
FIG. 3 is a schematic view illustrating one embodiment of a pixel provided in an area A of FIG. 2.
Figure 4:
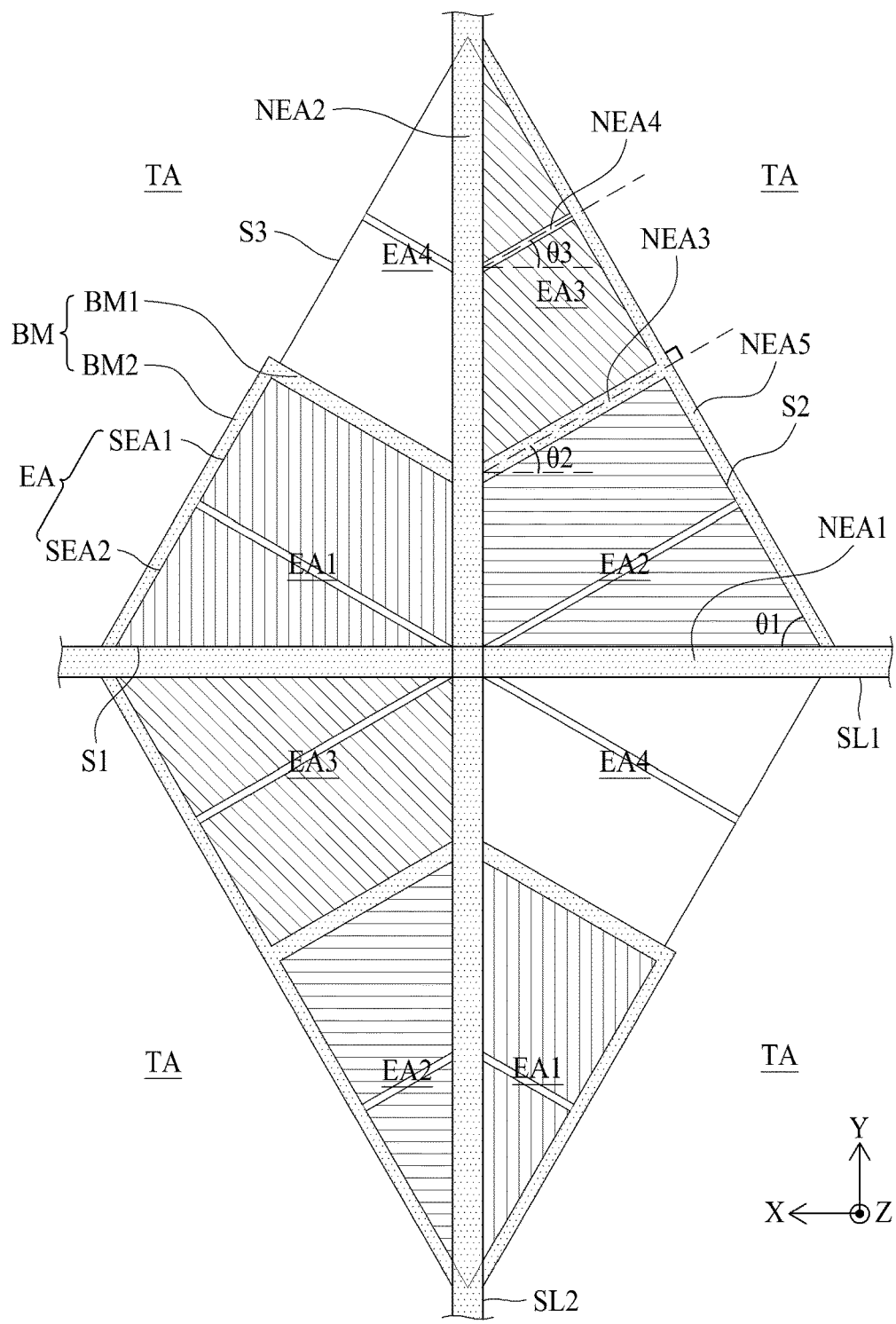
FIG. 4 is a detailed view illustrating a shape of a pixel.
Figure 5:
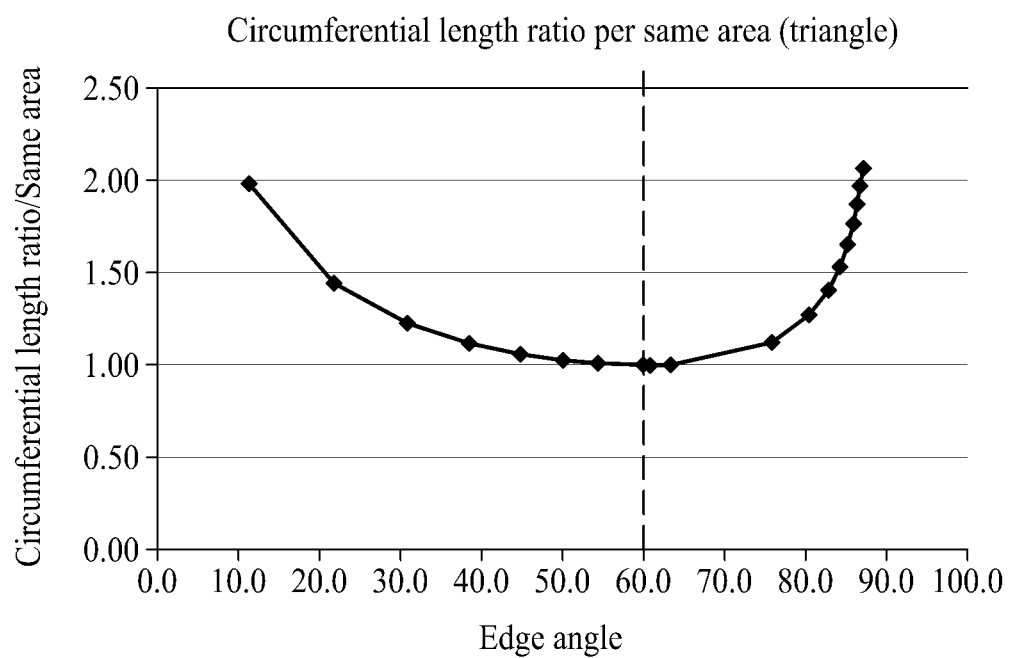
FIG. 5 is a graph illustrating a circumferential length ratio per same area for each edge angle of a triangle.

FIG. 3 is a schematic view illustrating one embodiment of a pixel provided in an area A of FIG. 2, FIG. 4 is a detailed view illustrating a shape of a pixel, and FIG. 5 is a graph illustrating a circumferential length ratio per same area for each edge angle of a triangle.

Referring to FIGS. 3 to 5, a transparent display panel 110 may be categorized into a display area DA provided with pixels P to display an image, and a non-display area NDA for not displaying an image.

The display area DA includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, about 90%, and the non-transmissive area NTA may be an area where light transmittance is smaller than β%, for example, about 50%. At this time, α is greater than β. A user may view an object or background arranged over a rear surface of the transparent display panel 110 due to the transmissive area TA.

A non-transmissive area NTA may be provided with a plurality of first signal lines SL1, a plurality of second signal lines SL2 and a pixel P.

The first signal lines SL1 may be extended from the display area DA in a first direction (e.g., X-axis direction). The plurality of first signal lines SL1 may be disposed to be spaced apart from one another. For example, the first signal lines SL1 may include gate lines. In this case, the first signal line SL1 may include two gate lines. For example, the first signal line SL1 may include a first gate line for supplying a gate signal to a plurality of subpixels SP1, SP2, SP3 and SP4 included in a first pixel and a second gate line for supplying a gate signal to a plurality of subpixels SP1, SP2, SP3 and SP4 included in a second pixel P2. The first and second gate lines may be provided between the first pixel P1 and the second pixel P2.

The second signal lines SL2 may be extended from the display area DA in a second direction (e.g., Y-axis direction), and may cross the first signal lines SL1 in the display area DA. The plurality of second signal lines SL2 may be disposed to be spaced apart from one another.

The second signal line SL2 may include a plurality of lines. For example, the second signal line SL2 may include at least one of a pixel power line VDD, a common power line VSS, a reference line REF, or data lines D1, D2, D3 and D4.

The pixel power line VDD may supply a first power source to a driving transistor of each of subpixels SP1, SP2, SP3 and SP4 provided in the display area DA. The common power line VSS may supply a second power source to a cathode electrode of the subpixels SP1, SP2, SP3 and SP4 provided in the display area DA. At this time, the second power source may be a common power source commonly supplied to the subpixels SP1, SP2, SP3 and SP4. The reference line VREF may supply an initialization voltage (or sensing voltage) to a driving transistor of each of the subpixels SP1, SP2, SP3 and SP4 provided in the display area DA. Each of the data lines D1, D2, D3 and D4 may supply a data voltage to the subpixels SP1, SP2, SP3 and SP4.

When the second signal line SL2 includes a pixel power line VDD, a common power line VSS, a reference line REF and data lines D1, D2, D3 and D4, the reference line REF and the pixel power line VDD may be disposed between any one of the plurality of data lines D1, D2, D3 and D4 and the common power line VSS. For example, as shown in FIG. 3, the first data line D1, the second data line D2, the pixel power line VDD, the reference line REF, the pixel power line VDD, the third data line D3 and the fourth data line D4 may be disposed in due order.

The reference line REF and the pixel power line VDD may be diverged from an area overlapped with the pixel P and connected with the plurality of subpixels SP1, SP2, SP3 and SP4. In detail, the reference line REF and the pixel power line VDD may be connected with a circuit portion of the plurality of subpixels SP1, SP2, SP3 and SP4, and may supply a reference signal or a power signal to each of the subpixels SP1, SP2, SP3 and SP4.

When the reference line REF and the pixel power line VDD are disposed outside an area where the second signal line SL2 is provided, deviation in a connection length between the diverged point and the circuit portion of each of the plurality of subpixels SP1, SP2, SP3 and SP4 is increased. For example, when the reference line REF is disposed at the leftmost of the area where the second signal line SL2 is provided, a connection length from the diverged point to the circuit portion disposed at a right side of the second signal line SL2 may be longer than a connection length from the diverged point to the circuit portion disposed at a left side of the second signal line SL2. In this case, a difference between a signal supplied to the circuit portion disposed at the right side of the second signal line SL2 and a signal supplied to the circuit portion disposed at the left side of the second signal line SL2 may occur.

In the transparent display panel 110 according to one embodiment of the present disclosure, the reference line REF and the pixel power line VDD may be disposed between any one of the plurality of data lines D1, D2, D3 and D4 and the common power line VSS, that is, in an intermediate area. That is, the reference line REF and the pixel power line VDD may reduce or minimize deviation in the connection lengths from the diverged point to the circuit portion of each of the subpixels SP1, SP2, SP3 and SP4. As a result, the reference line REF and the pixel power line VDD may uniformly supply a signal to the circuit portion of each of the plurality of subpixels SP1, SP2, SP3 and SP4.

A transmissive area TA may be disposed between the first signal lines SL1 adjacent to each other. Also, the transmissive area TA may be disposed between the second signal lines SL2 adjacent to each other. That is, the transmissive area TA may be surrounded or at least partially surrounded by two first signal lines SL1 and two second signal lines SL2.

The pixels P are provided in the overlapping area IA where the first signal line SL1 the second signal line SL2 cross each other, and display an image by emitting predetermined (or selected) light. An emission area EA may correspond to an area for emitting light in the pixel P.

The transparent display panel 110 according to one embodiment of the present disclosure may include two pixels in the overlapping area IA where the first signal line SL1 and the second signal SL2 cross each other. In detail, the transparent display panel 110, as shown in FIG. 3, may include the first pixel P1 and the second pixel P2, which are disposed based on the overlapping area IA where the first signal line SL1 and the second signal line SL2 cross each other.

Each of the first pixel P1 and the second pixel P2 may include a first subpixel SP1, a second subpixel SP2, a third subpixel SP3 and a fourth subpixel SP4, as shown in FIG. 3.

The first subpixel SP1 may include a first emission area EA1 emitting light of a first color, and the second subpixel SP2 may include a second emission area EA2 emitting light of a second color. The third subpixel SP3 may include a third emission area EA3 emitting light of a third color, and the fourth subpixel SP4 may include a fourth emission area EA4 emitting light of a fourth color.

As an example, the first to fourth emission areas EA1, EA2, EA3 and EA4 may respectively emit light of respective colors different from one another. For example, the first emission area EA1 may emit red light, and the second emission area EA2 may emit green light. The third emission area EA3 may emit blue light, and the fourth emission area EA4 may emit white light. However, the emission areas are not limited to this example.

As another example, at least two of the first to fourth emission areas EA1, EA2, EA3 and EA4 may emit light of the same color. For example, the first emission area EA1 and the second emission area EA2 may emit green light, the third emission area EA2 may emit red light, and the fourth emission area EA4 may emit blue light. However, the emission areas are not limited to this example. Also, the arrangement order of the subpixels SP1, SP2, SP3 and SP4 may be changed in various ways.

Hereinafter, for convenience of description, a description will be based on that the first subpixel SP1 is a red subpixel for emitting red light, the second subpixel SP2 is a green subpixel for emitting green light, the third subpixel SP3 is a blue subpixel for emitting blue light, and the fourth subpixel SP4 is a white subpixel for emitting white light.

In the transparent display panel 110 according to one embodiment of the present disclosure, the first pixel P1 and the second pixel P2 may be different from each other in the arrangement order of the subpixels SP1, SP2, SP3 and SP4 included in each of them. In the transparent display panel 110 according to one embodiment of the present disclosure, considering a spaced distance between subpixels emitting light of the same color, the subpixels SP1, SP2, SP3 and SP4 may be disposed in each of the first pixel P1 and the second pixel P2.

In detail, the subpixels SP1, SP2, SP3 and SP4 emitting light of the same color may be disposed such that a first spaced distance in a first direction may be uniform. In this case, the first spaced distance denotes a distance where center points of the respective subpixels adjacent to each other in the first direction, emitting light of the same color are spaced apart from each other. The center points may denote overlapping points of straight lines connecting middle portions of each side. Accordingly, in some embodiments, the arrangement order of the subpixels SP1, SP2, SP3 and SP4 may equally be applied to the first pixels P1 adjacent to each other in the first direction. Also, the arrangement order of the subpixels SP1, SP2, SP3 and SP4 may equally be applied to the second pixels P2 adjacent to each other in the first direction.

The subpixels SP1, SP2, SP3 and SP4 emitting light of the same color may be disposed such that a second spaced distance in the second direction is adjacent to the first spaced distance in the first direction. The second spaced distance means a distance where center points of the respective subpixels adjacent to each other in the second direction, emitting light of the same color are spaced apart from each other.

Accordingly, in some embodiments, the first pixel P1 and the second pixel P2, which are adjacent to each other in the second direction, may be different from each other in the arrangement order of the subpixels SP1, SP2, SP3 and SP4. Therefore, the first pixel P1 and the second pixel P2 may be different from each other in at least one of shapes or emission areas of the subpixels SP1, SP2, SP3 and SP4 emitting light of the same color.

For example, in the first pixel P1, the first subpixel SP1 may be disposed at a left side of the second signal line SL2 and disposed in an area relatively adjacent to the first signal line SL1. On the other hand, in the second pixel P2, the first subpixel SP1 may be disposed at a right side of the second signal line SL2 and disposed in an area relatively far away from the first signal line SL1. When the first subpixel SP1 of the second pixel P2 is disposed at the left side of the second signal line SL2 or disposed at an area adjacent to the first signal line SL1, a difference between the spaced distance in the second direction and the first spaced distance in the first direction may become too large. Also, a difference between the spaced distances in the second direction may also become too large.

The transparent display panel 110 according to one embodiment of the present disclosure may reduce or minimize the difference between the spaced distance in the second direction and the first spaced distance in the first direction among the subpixels SP1, SP2, SP3 and SP4 emitting light of the same color. Also, the transparent display panel 110 according to one embodiment of the present disclosure may allow the difference between the spaced distances in the second direction among the subpixels SP1, SP2, SP3 and SP4 emitting light of the same color to be within a certain range. In one embodiment, in the subpixels SP1, SP2, SP3 and SP4 emitting light of the same color, the difference between the first spaced distance in the first direction and the second spaced distance in the second direction may be less than about 10% of the first spaced distance.

As one embodiment that satisfies such a condition, the subpixels SP1, SP2, SP3 and SP4 emitting light of the same color may be disposed in the first pixel P1 and second pixel P2 in a diagonal direction. Also, when the subpixels SP1, SP2, SP3 and SP4 emitting light of the same color are disposed in an area of the first pixel P1, which is adjacent to the first signal line SL1, they may be disposed in an area of the second pixel P2, which is far away from the first signal line SL1.

The transparent display panel 110 according to one embodiment of the present disclosure may prevent picture quality from being deteriorated by reducing deviation in the spaced distances among the subpixels SP1, SP2, SP3 and SP4 emitting light of the same color.

Meanwhile, in the transparent display panel 110 according to one embodiment of the present disclosure, the first pixel P1 and the second pixel P2 may be symmetrical with each other by interposing one of the first signal line SL1 and the second signal line SL2 therebetween. For example, the first pixel P1 and the second pixel P2 may be symmetrical with each other by interposing the first signal line SL1 therebetween. Although FIG. 3 illustrates that the first pixel P1 and the second pixel P2 are symmetrical with each other by interposing the first signal line SL1 therebetween, the present disclosure is not limited to the example of FIG. 3. For another example, the first pixel P1 and the second pixel P2 may be symmetrical with each other by interposing the second signal line SL2 therebetween.

Hereinafter, for convenience of description, a description will be given based on that the first pixel P1 and the second pixel P2 are symmetrical with each other by interposing the first signal line SL1 therebetween.

The first pixel P1 may have a triangular shape, and the second pixel P2 may have a triangular shape symmetrical with the first pixel P1 by interposing the first signal line SL1.

In this case, each of the first pixel P1 and the second pixel P2, as shown in FIG. 4, may include a first side S1 parallel with the first signal line SL1, and second and third sides S2 and S3 oriented toward the transmissive area TA. That is, each of the first pixel P1 and the second pixel P2 may have a triangular shape comprised of the first side S1, the second side S2 and the third side S3.

In one embodiment, each of the second side S2 and the third side S3 may form about 60° with the first side S1. That is, each of the first pixel P1 and the second pixel P2 may be a regular triangle. A circumferential length ratio per same area for each edge angle of a triangle is shown in FIG. 5. Referring to FIG. 5, when an edge angle of the triangle is about 60°, it is noted that the circumferential length ratio per same area has the smallest value. Therefore, it is noted that a circumferential length of a regular triangle among triangular shapes having the same area has the smallest value.

In the transparent display panel 110 according to one embodiment of the present disclosure, edge angles θ1 of the pixels P1 and P2 may be formed at about 60°, whereby the pixels P1 and P2 may have the smallest circumferential length.

The non-transmissive area NTA may include an emission area EA and a non-emission area NEA.

The emission area EA may be provided with the plurality of subpixels SP1, SP2, SP3 and SP4 to emit light of a predetermined (or selected) color, and may include a first emission area EA1, a second emission area EA2, a third emission area EA3 and a fourth emission area EA4, which are respectively provided in the plurality of subpixels SP1, SP2, SP3 and SP4.

The non-emission area NEA may not emit light, and may include a first non-emission area NEA1, a second non-emission area NEA2 and a third non-emission area NEA3. In one embodiment, the non-emission area NEA may further include at least one of a fourth non-emission area NEA4 or a fifth non-emission area NEA5.

The first non-emission area NEA1 may be provided between the first pixel P1 and the second pixel P2 along the first signal line SL1. The first subpixel SP1, the second subpixel SP2, the third subpixel SP3 and the fourth subpixel SP4, which respectively emit light of different colors from one another, may be disposed at each of one side and the other side of the first non-emission area NEA1.

In detail, since the first non-emission area NEA1 is provided between the first pixel P1 and the second pixel P2, the first pixel P1 may be provided at one side, and the second pixel P2 may be provided at the other side. That is, the first subpixel SP1, the second subpixel SP2, the third subpixel SP3 and the fourth subpixel SP4, which are included in the first pixel P1, may be provided at one side of the first non-emission area NEA1, and the first subpixel SP1, the second subpixel SP2, the third subpixel SP3 and the fourth subpixel SP4, which are included in the second pixel P2, may be provided at the other side of the first non-emission area NEA1.

The second non-emission area NEA2 may be provided along the second signal line SL2. The first subpixel SP1, the second subpixel SP2, the third subpixel SP3 and the fourth subpixel SP4, which respectively emit light of different colors from one another, may be disposed at each of one side and the other side of the second non-emission area NEA2, in the same manner as the first non-emission area NEA1.

However, unlike the first non-emission area NEA1, the second non-emission area NEA2 may be provided to pass through the inside of each of the first pixel P1 and the second pixel P2. Therefore, a portion of the first pixel P1 and a portion of the second pixel P2 may be disposed at one side of the second non-emission area NEA2, and the other portion of the first pixel P1 and the other portion of the second pixel P2 may be disposed at the other side of the second non-emission area NEA2. The third subpixel SP3 and the fourth subpixel SP4 of the first pixel P1 and the first subpixel SP1 and the second subpixel SP2 of the second pixel P2 may be disposed at one side of the second non-emission area NEA2.

The third non-emission area NEA3 may be provided among the subpixels SP1, SP2, SP3 and SP4 disposed at one side of the second non-emission area NEA2 and among the subpixels SP1, SP2, SP3 and SP4 disposed at the other side of the second non-emission area NEA2.

The third non-emission area NEA3 may be diverged from the second non-emission area NEA2 and extended toward the transmissive area TA. At this time, the third non-emission area NEA3 may be inclined with respect to the first signal line SL1 and the second signal line SL2.

In detail, the third non-emission area NEA3, as shown in FIG. 4, may be provided from one point of the second side S2 or the third side S3 of the pixels P1 and P2 to the second non-emission area NEA2. At this time, the third non-emission area NEA3 may be provided to be vertical to the second side S2 or the third side S3 of the pixels P1 and P2. In this case, since a length from one point of the second side S2 or the third side S3 of the pixels P1 and P2 to the second non-emission area NEA2 is the shortest, the third non-emission area NEA3 may be provided to be vertical to the second side S2 or the third side S3 of the pixels P1 and P2, thereby having a minimum length.

When the third non-emission area NEA3 is vertical to the second side S2 or the third side S3 of the pixels P1 and P2, the third non-emission area NEA3 may be inclined with respect to the first signal line SL1 and the second signal line SL2. When each of the pixels P1 and P2 is a regular triangle, the third non-emission area NEA3 may form an angle θ2 of about 30° with respect to the first signal line SL1, and may form an angle of about 60° with respect to the second signal line SL2.

The fourth non-emission area NEA4 may be provided in one of the subpixels SP1, SP2, SP3 and SP4. In one embodiment, each of the plurality of subpixels SP1, SP2, SP3 and SP4 may include emission areas EA1, EA2, EA3 and EA4 comprised of a first sub-emission area SEA1 and a second sub-emission area SEA2. In this case, the fourth non-emission area NEA4 for not emitting light may be provided between the first sub-emission area SEA1 and the second sub-emission area SEA2 of each of the plurality of subpixels SP1, SP2, SP3 and SP4.

The fourth non-emission area NEA4 may be diverged from the second non-emission area NEA2 and extended toward the transmissive area TA. At this time, the fourth non-emission area NEA4 may be inclined with respect to the first signal line SL1 and the second signal line SL2.

In detail, the fourth non-emission area NEA4, as shown in FIG. 4, may be provided from one point of the second side S2 or the third side S3 of the pixels P1 and P2 to the second non-emission area NEA2. At this time, the fourth non-emission area NEA4 may be provided to be vertical to the second side S2 or the third side S3 of the pixels P1 and P2. In this case, since a length from one point of the second side S2 or the third side S3 of the pixels P1 and P2 to the second non-emission area NEA2 is the shortest, the fourth non-emission area NEA4 may be provided to be vertical to the second side S2 or the third side S3 of the pixels P1 and P2, thereby having a minimum length.

When the fourth non-emission area NEA4 is vertical to the second side S2 or the third side S3 of the pixels P1 and P2, the fourth non-emission area NEA4 may be inclined with respect to the first signal line SL1 and the second signal line SL2. When each of the pixels P1 and P2 is a regular triangle, the fourth non-emission area NEA4 may form an angle θ2 of about 30° with respect to the first signal line SL1, and may form an angle of about 60° with respect to the second signal line SL2. The fourth non-emission area NEA4 may be provided in parallel with the third non-emission area NEA3.

The fifth non-emission area NEA5 may be provided between each of the pixels P1 and P2 and the transmissive area TA. The fifth non-emission area NEA5 may be provided along the second side S2 and the third side S3 of each of the first pixel P1 and the second pixel P2. In one embodiment, the fifth non-emission area NEA5 may not be provided between the fourth subpixel SP4 of each of the first pixel P1 and the second pixel P2 and the transmissive area TA.

The non-emission area NEA may be provided with a black matrix BM. The black matrix BM may include a first black matrix BM1 and a second black matrix BM2.

The first black matrix BM1 may be provided in the first non-emission area NEA1, the second non-emission area NEA2 and the third non-emission area NEA3. The first black matrix BM1 may be provided among the plurality of subpixels SP1, SP2, SP3 and SP4 to prevent color mixture from occurring among the plurality of subpixels SP1, SP2, SP3 and SP4.

The second black matrix BM2 may be provided in the fifth non-emission area NEA5. The second black matrix BM2 may be provided between each of the plurality of subpixels SP1, SP2, SP3 and SP4, which are included in the pixels P1 and P2, and the transmissive area TA to prevent light emitted from each of the plurality of subpixels SP1, SP2, SP3 and SP4 from being seen as light of another color depending on a viewing angle. In one embodiment, the second black matrix BM2 may not be provided between the fourth subpixel SP4 and the transmissive area TA. When the fourth subpixel SP4 is a white pixel for emitting white light, the white light emitted from the fourth subpixel SP4 is not varied depending on a viewing angle. Therefore, the second black matrix BM2 is not provided between the fourth subpixel SP4 and the transmissive area TA, whereby transmittance may be improved and light loss caused by the second black matrix BM2 may be reduced.

Since the black matrix BM is made of a material that shields or absorbs light, the light emitted from the subpixels SP1, SP2, SP3 and SP4 may not pass through the area where the black matrix BM is provided and the externally incident light may not transmit the area where the black matrix BM is provided. Therefore, the area where the black matrix BM is provided corresponds to the non-emission area NEA from which light is not emitted.

Since the black matrix BM shields or absorbs light, the black matrix BM may greatly affect transmittance of the transparent display panel 110. In detail, transmittance of the transparent display panel 110 may be reduced when the area where the black matrix BM is provided, that is, the non-emission area NEA is increased. On the other hand, transmittance of the transparent display panel 110 may be increased when the non-emission area NEA is reduced.

The transparent display panel 110 according to one embodiment of the present disclosure has a pixel P structure for reducing the area where the black matrix BM is provided.

In the transparent display panel 110 according to one embodiment of the present disclosure, two pixels may be provided to be symmetrical with each other in an overlapping area IA. Therefore, in the transparent display panel 110 according to one embodiment of the present disclosure, two pixels, the first pixel P1 and the second pixel P2 may correspond to one transmissive area TA. In this transparent display panel 110, since a total size of the transmissive area TA is increased, transmittance may be improved.

Also, in the transparent display panel 110 according to one embodiment of the present disclosure, a total outer length of the transmissive area TA may be reduced as compared with the transparent display panel in which the pixel P and the transmissive area TA correspond to each other one to one.

Also, in the transparent display panel 110 according to one embodiment of the present disclosure, each of the first pixel P1 and the second pixel P2 may be provided to have a regular triangle of the shortest circumferential length among triangles having the same area. In the transparent display panel 110 according to one embodiment of the present disclosure, edge angles of the pixels P1 and P2 may be formed at about 60°, whereby the pixels P1 and P2 may have the shortest circumferential length.

Considering the aforementioned description, the transparent display panel 110 according to one embodiment of the present disclosure may reduce or minimize the outer length of the transmissive area TA. Therefore, the transparent display panel 110 according to one embodiment of the present disclosure may reduce or minimize a total size of the second black matrix BM2, and may improve transmittance.

Also, in the transparent display panel 110 according to one embodiment of the present disclosure, the third non-emission area NEA3 is formed to be vertical to the second side S2 or the third side S3 of the pixels P1 and P2, whereby the length of the third non-emission area NEA3 may be reduced or minimized. Therefore, the transparent display panel 110 according to one embodiment of the present disclosure may reduce the total size of the first black matrix BM1, and may improve transmittance.

Also, in the transparent display panel 110 according to one embodiment of the present disclosure, the fourth non-emission area NEA4 is formed to be vertical to the second side S2 or the third side S3 of the pixels P1 and P2, whereby the length of the fourth non-emission area NEA4 may be reduced or minimized. Therefore, the transparent display panel 110 according to one embodiment of the present disclosure may reduce or minimize loss of the emission area EA due to the fourth non-emission area NEA4 even though the emission area EA is divided into the first sub-emission area SEA1 and the second sub-emission area SEA2.

Also, in the transparent display panel 110 according to one embodiment of the present disclosure, the first pixel P1 and the second pixel P2 are provided in the overlapping area IA where the first signal line SL1 and the second signal line SL2 cross each other, and each of the first pixel P and the second pixel P2 includes the plurality of subpixels SP1, SP2, SP3 and SP4 disposed based on the overlapping area IA. In the transparent display panel 110 according to one embodiment of the present disclosure, the plurality of subpixels SP1, SP2, SP3 and SP4 are together disposed based on the overlapping area IA, whereby definition of picture quality and readability may be improved.

Hereinafter, the structure of the pixel P will be described in more detail with reference to FIGS. 6 to 8.

Figure 6:
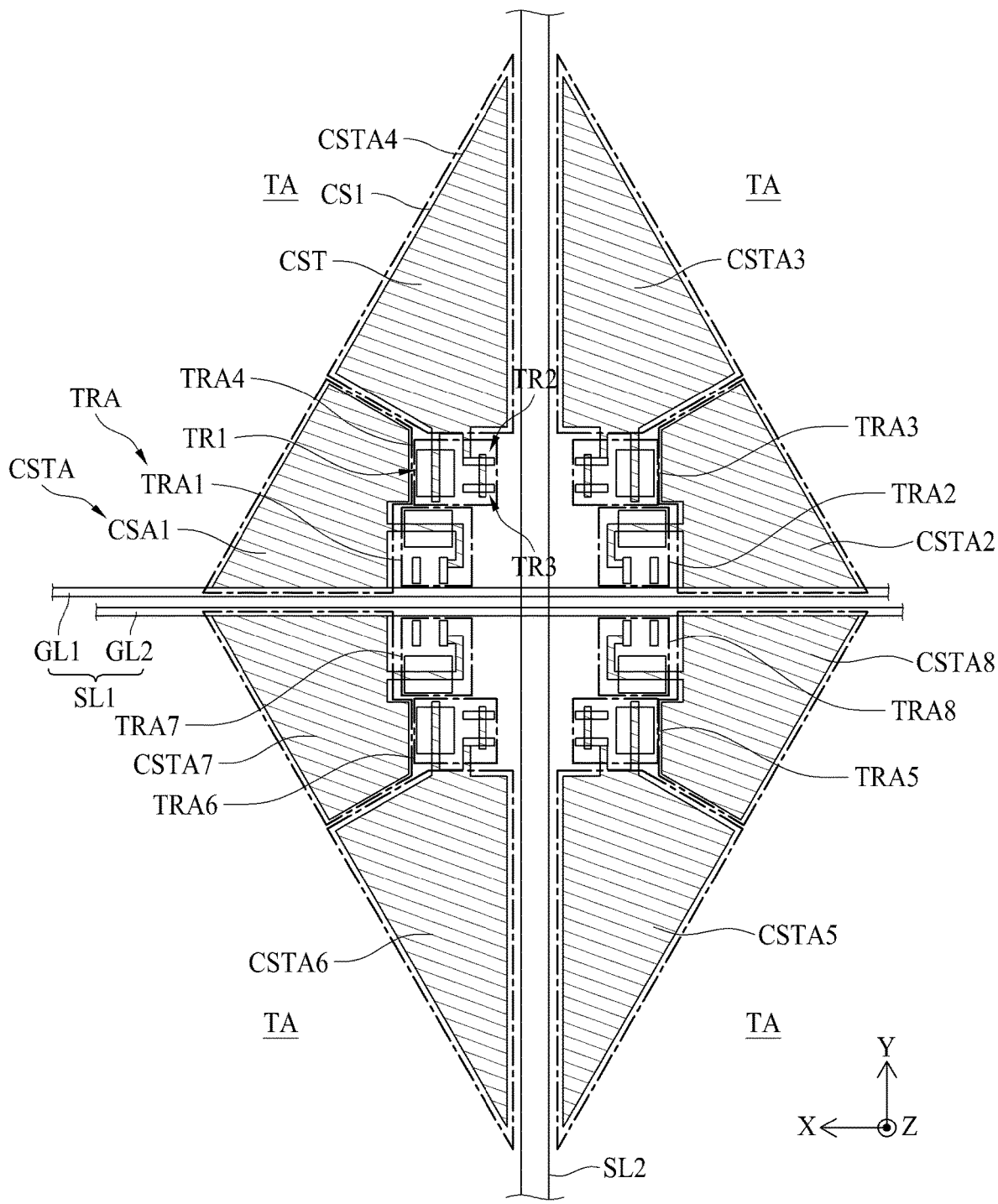
FIG. 6 is a schematic view illustrating a transistor and a capacitor in an area B of FIG. 3.
Figure 7:
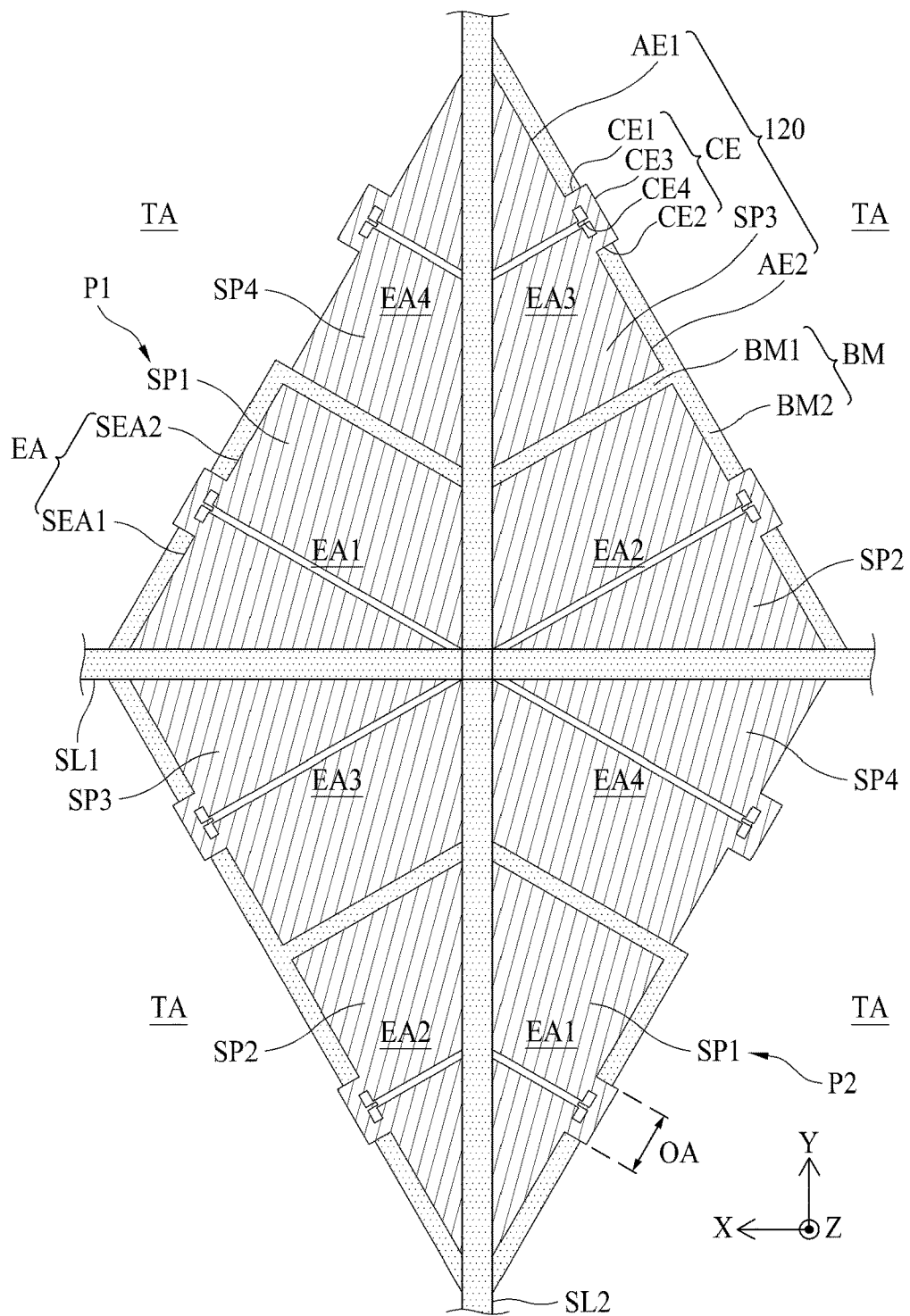
FIG. 7 is a schematic view illustrating a first electrode in an area B of FIG. 3.
Figure 8:
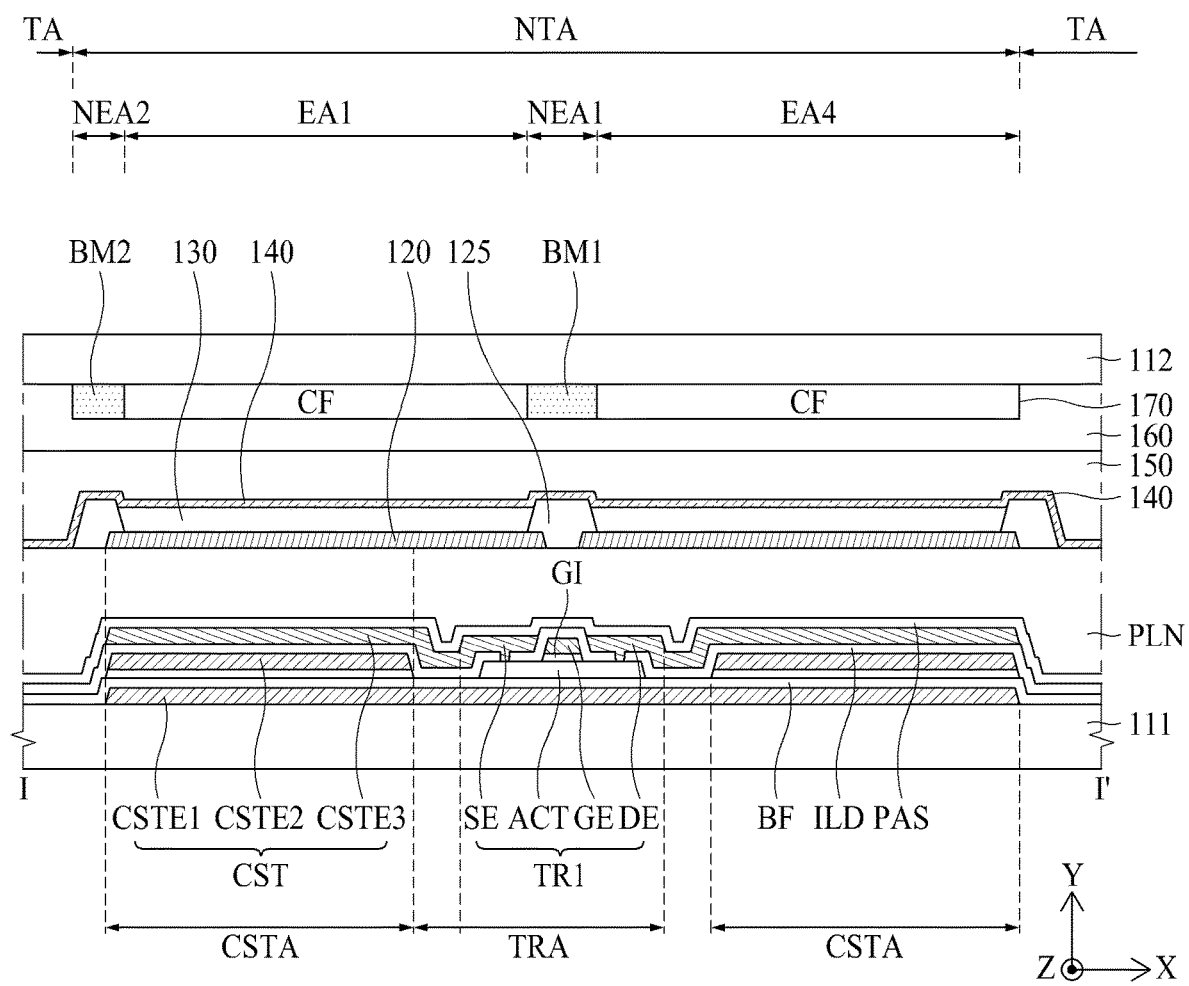
FIG. 8 is a cross-sectional view taken along line I-I' of FIG. 3.

FIG. 6 is a schematic view illustrating a transistor and a capacitor in an area B of FIG. 3, FIG. 7 is a schematic view illustrating a first electrode in an area B of FIG. 3, and FIG. 8 is a cross-sectional view taken along line I-I' of FIG. 3.

Referring to FIGS. 6 to 8, each of the first pixel P1 and the second pixel P2 may include a first subpixel SP1, a second subpixel SP2, a third subpixel SP3 and a fourth subpixel SP4. Each of the plurality of subpixels SP1, SP2, SP3 and SP4 may include a circuit element, which includes at least one or more transistors TR1, TR2 and TR3 and a capacitor CST, and a light emitting diode.

At least one or more transistors may include a driving transistor TR1, a switching transistor TR2 and a sensing transistor TR3.

The switching transistor TR2 is switched in accordance with a gate signal supplied to a gate line and charges a data voltage supplied from a data line in the capacitor CST.

The sensing transistor TR3 serves to sense a threshold voltage deviation of the driving transistor TR1, which causes deterioration of picture quality, in accordance with a sensing signal.

The driving transistor TR1 is switched in accordance with the data voltage charged in the capacitor CST to generate a data current from a power source supplied from the pixel power line VDD, and then serves to supply the generated data current to a first electrode 120 of the subpixels SP1, SP2, SP3 and SP4.

The driving transistor TR1 may include an active layer ACT, a gate electrode GE, a source electrode SE and a drain electrode DE, and the capacitor CST may include a first capacitor electrode CSTE1, a second capacitor electrode CSTE2 and a third capacitor electrode CSTE3.

In detail, the first capacitor electrode CSTE1 may be provided over a first substrate 111. The first capacitor electrode CSTE1 may serve as a light shielding layer for shielding external light entering the active layer ACT from an area TRA where the driving transistor TR1 is provided. The first capacitor electrode CSTE1 may be formed of a single layer or a multi-layer made of any one of Mo, Al, Cr, Au, Ti, Ni, Nd and Cu, or their alloy.

A buffer film BF may be provided over the first capacitor electrode CSTE1 and the light shielding layer (not shown). The buffer film BF may protect the transistors TR1, TR2 and TR3 and the capacitor CST from moisture permeated through the first substrate 111 vulnerable to moisture permeability, and may be formed of an inorganic film, for example, a silicon oxide film (SiOx), a silicon nitride film (SiNx) or a multi-layered film of SiOx and SiNx.

The active layer ACT may be provided over the buffer film BF. The active layer ACT may be formed of a silicon based semiconductor material or an oxide based semiconductor material.

A gate insulating film GI may be provided over the active layer ACT. The gate insulating film GI may be formed of an inorganic film, for example, a silicon oxide film (SiOx), a silicon nitride film (SiNx) or a multi-layered film of SiOx and SiNx.

The gate electrode GE and the second capacitor electrode CSTE2 may be provided over the gate insulating film GI. The second capacitor electrode CSTE2 may be extended from the gate electrode GE. The gate electrode GE and the second capacitor electrode CSTE2 may be formed of a single layer or a multi-layer made of any one of Mo, Al, Cr, Au, Ti, Ni, Nd and Cu, or their alloy.

Although FIG. 8 illustrates that the driving transistor TR1 is formed in a top gate method in which the gate electrode GE is disposed above the active layer ACT, the driving transistor TR1 s not limited to the example of FIG. 8. The driving transistor TR1 may be formed in a bottom gate method in which the gate electrode GE is disposed below the active layer ACT or a double gate method in which the gate electrode GE is disposed above and below the active layer ACT.

An inter-layer dielectric film ILD may be provided over the gate electrode GE and the second capacitor electrode CSTE2. The inter-layer dielectric film ILD may be made of an inorganic film, for example, a silicon oxide film (SiOx), a silicon nitride film (SiNx) or a multi-layered film of SiOx and SiNx.

The source electrode SE, the drain electrode DE and the third capacitor electrode CSTE3 may be provided over the inter-layer dielectric film ILD. The third capacitor electrode CSTE3 may be extended from the source electrode SE. The source electrode SE and the drain electrode DE may be connected to the active layer ACT through a contact hole passing through the gate insulating film GI and the inter-layer dielectric film ILD.

The source electrode SE, the drain electrode DE and the third capacitor electrode CSTE3 may be made of a single layer or a multi-layer of any one of Mo, Al, Cr, Au, Ti, Ni, Nd and Cu, or their alloy.

A passivation film PAS for insulating the driving transistor TR1 from the capacitor CST may be provided over the source electrode SE, the drain electrode DE and the third capacitor electrode CSTE3. The passivation film PAS may be made of an inorganic film, for example, a silicon oxide film (SiOx), a silicon nitride film (SiNx) or a multi-layered film of SiOx and SiNx.

Although FIG. 8 illustrates that the capacitor CST includes a first capacitor electrode CSTE1, a second capacitor electrode CSTE2 and a third capacitor electrode CSTE3, the capacitor is not limited to the example of FIG. 8. The capacitor CST may include at least two or more of the first capacitor electrode CSTE1, the second capacitor electrode CSTE2 and the third capacitor electrode CSTE3.

The circuit element provided as described above may include a first circuit area TRA provided with at least one or more transistors TR1, TR2 and TR3 and a second circuit area CSTA provided with a capacitor CST, as shown in FIG. 6.

The first circuit area TRA may include four transistor areas TRA1, TRA2, TRA3 and TRA4 disposed at one side of the first signal line SL1 and four transistor areas TRA5, TRA6, TRA7 and TRA8 disposed at the other side of the first signal line SL1. The four transistor areas TRA1, TRA2, TRA3 and TRA4 disposed at one side of the first signal line SL1 may be provided to be symmetrical with the four transistors TRA5, TRA6, TRA7 and TRA8, which are disposed at the other side of the first signal line SL1, based on the first signal line SL1.

The driving transistor TR1, the switching transistor TR2 and the sensing transistor TR3 may be provided in each of the first to eighth transistor areas TRA1, TRA2, TRA3, TRA4, TRA5, TRA6, TRA7 and TRA8.

The second circuit area CSTA may be disposed between the first circuit area TRA and the transmissive area TA. In detail, the second circuit area CSTA may include a first capacitor area CSTA1 disposed between the first transistor area TRA1 and the transmissive area TA, a second capacitor area CSTA2 disposed between the second transistor area TRA2 and the transmissive area TA, a third capacitor area CSTA3 disposed between the third transistor area TRA3 and the transmissive area TA, and a fourth capacitor area CSTA4 disposed between the fourth transistor area TRA4 and the transmissive area TA, at one side of the first signal line SL1. Also, the second circuit area CSTA may include a fifth capacitor area CSTA5 disposed between the fifth transistor area TRA5 and the transmissive area TA, a sixth capacitor area CSTA6 disposed between the sixth transistor area TRA6 and the transmissive area TA, a seventh capacitor area CSTA7 disposed between the seventh transistor area TRA7 and the transmissive area TA, and an eighth capacitor area CSTA8 disposed between the eighth transistor area TRA8 and the transmissive area TA, at the other side of the first signal line SL1.

The capacitor CST may be provided in each of the first to eighth capacitor areas CSTA1, CSTA2, CSTA3, CSTA4, CSTA5, CSTA6, CSTA7 and CSTA8.

The driving transistor TR1 of the first transistor area TRA1 may be switched in accordance with the data voltage charged in the capacitor CST of the first capacitor area CSTA1 to supply the power source supplied from the pixel power line VDD to the first electrode 120 of the first subpixel SP1 of the first pixel P1. Also, the driving transistor TR1 of the second transistor area TRA2 may be switched in accordance with the data voltage charged in the capacitor CST of the second capacitor area CSTA2 to supply the power source supplied from the pixel power line VDD to the first electrode 120 of the second subpixel SP2 of the first pixel P1. The driving transistor TR1 of the third transistor area TRA3 may be switched in accordance with the data voltage charged in the capacitor CST of the third capacitor area CSTA3 to supply the power source supplied from the pixel power line VDD to the first electrode 120 of the third subpixel SP3 of the first pixel P1. The driving transistor TR1 of the fourth transistor area TRA4 may be switched in accordance with the data voltage charged in the capacitor CST of the fourth capacitor area CSTA4 to supply the power source supplied from the pixel power line VDD to the first electrode 120 of the fourth subpixel SP4 of the first pixel P1.

The driving transistor TR1 of the fifth transistor area TRA5 may be switched in accordance with the data voltage charged in the capacitor CST of the fifth capacitor area CSTA5 to supply the power source supplied from the pixel power line VDD to the first electrode 120 of the first subpixel SP1 of the second pixel P2. Also, the driving transistor TR1 of the sixth transistor area TRA6 may be switched in accordance with the data voltage charged in the capacitor CST of the sixth capacitor area CSTA6 to supply the power source supplied from the pixel power line VDD to the first electrode 120 of the second subpixel SP2 of the second pixel P2. The driving transistor TR1 of the seventh transistor area TRA7 may be switched in accordance with the data voltage charged in the capacitor CST of the seventh capacitor area CSTA7 to supply the power source supplied from the pixel power line VDD to the first electrode 120 of the third subpixel SP3 of the second pixel P2. The driving transistor TR1 of the eighth transistor area TRA8 may be switched in accordance with the data voltage charged in the capacitor CST of the eighth capacitor area CSTA8 to supply the power source supplied from the pixel power line VDD to the first electrode 120 of the fourth subpixel SP4 of the second pixel P2.

In the transparent display panel 110 according to one embodiment of the present disclosure, the first circuit area TRA and the second circuit area CSTA may be disposed so as not to overlap at least a part of first signal line SL1 and at least a part of the second signal line SL2. In the transparent display panel 110 according to one embodiment of the present disclosure, at least one or more transistors TR1, TR2 and TR3 and the capacitor CST may not overlap the first signal line SL1 and the second signal line SL2, whereby a parasitic cap may be prevented from being generated between electrodes which overlap each other.

Also, in the transparent display panel 110 according to one embodiment of the present disclosure, the first circuit area TRA may be disposed to be more adjacent to the overlapping area IA than the second circuit area CSTA. At least one or more transistors TR1, TR2 and TR3 provided in the first circuit area TRA may be connected with a connection line diverged from at least one of the first signal line SL1 or the second signal line SL2. In the transparent display panel 110 according to one embodiment of the present disclosure, the first circuit area TRA may be disposed to be adjacent to the overlapping area IA, whereby a length of connection line for connecting the transistors TR1, TR2 and TR3 with the signal lines SL1 and SL2 may be reduced or minimized. As a result, the transparent display panel 110 according to one embodiment of the present disclosure may reduce or minimize loss of the voltage, which is transferred from the first signal line SL1 or the second signal line SL2, due to resistance.

Meanwhile, in the transparent display panel 110 according to one embodiment of the present disclosure, the second circuit area CSTA may be disposed between the first circuit area TRA and the transmissive area TA. In this case, a shape of the transmissive area TA may be determined by the capacitor CST provided in the second circuit area CSTA.

In the capacitor CST, at least one side oriented toward the transmissive area TA may have the same shape as that of the pixel P. In detail, in the capacitor CST, at least one side oriented toward the transmissive area TA may be inclined with respect to each of the first signal line SL1 and the second signal line SL2.

The capacitor CST provided in each of the first to eighth capacitor areas CSTA1, CSTA2, CSTA3, CSTA4, CSTA5, CSTA6, CSTA7 and CSTA8 may include one first side CS1 oriented toward the transmissive area TA.

The first side CS1 of the capacitor CST may be inclined without being parallel with or vertical to the first signal line SL1. That is, the first side CS1 of the capacitor CST may have an inclination of about 60° with respect to the first signal line SL1.

Also, the first side CS1 of the capacitor CST may be inclined without being parallel with or vertical to the second signal line SL2. That is, the first side CS1 of the capacitor CST may have an inclination of about 30° with respect to the second signal line SL2.

The capacitor CST may be provided to have a maximum wide area in an area excluding the first circuit area CSTA, the first signal line SL1 and the second signal line SL2 from the pixel P. Accordingly, in some embodiments, in the transparent display panel 110 according to one embodiment of the present disclosure, the first side CS1 of the capacitor CST may have the same shape as that of a side of each of the subpixels SP1, SP2, SP3 and SP4, which is oriented toward the transmissive area TA. Moreover, in the transparent display panel 110 according to one embodiment of the present disclosure, an end of the first side CS1 of the capacitor CST may be equal to that of a side of each of the subpixels SP1, SP2, SP3 and SP4, which is oriented toward the transmissive area TA. In one embodiment, the capacitor CST may have the same end as that of the first electrode 120 at the side oriented toward the transmissive area TA.

The transparent display panel 110 according to one embodiment of the present disclosure described as above may make sure of maximum capacity of the capacitor CST and improve luminance.

Also, in the transparent display panel 110 according to one embodiment of the present disclosure, the shape of the transmissive area TA may freely be changed depending on the shape of the first side CS1 of the capacitor CST, whereby a degree of freedom in design of the transmissive area TA may be acquired without loss of transmittance.

Referring to FIG. 8 again, a planarization film PLN for planarizing a step difference caused by the driving transistor TR1 and the capacitor CST may be provided over the passivation film PAS. The planarization film PLN may be formed of an organic film such as acryl resin, epoxy resin, phenolic resin, polyamide resin, and polyimide resin.

The light emitting diode, which is comprised of a first electrode 120, an organic light emitting layer 130 and a second electrode 130, and a bank 125 may be provided over the planarization film PLN.

The first electrode 120 may be provided over the planarization film PLN for each of the subpixels SP1, SP2, SP3 and SP4. The first electrode 120 is not provided in the transmissive area TA.

The first electrode 120 may be connected with the driving transistor TR1. In detail, the first electrode 120 may be connected to one of the source electrode SE and the drain electrode DE through a contact hole passing through the planarization film PLN. For example, the first electrode 120 may be connected to the source electrode SE or the third capacitor electrode CSTE3 extended from the source electrode SE through the contact hole passing through the planarization film PLN.

In one embodiment, the first electrode 120, as shown in FIG. 7, may include a first anode electrode AE1, a second anode electrode AE2 and a connection electrode CE.

The first anode electrode AE1 and the second anode electrode AE2 may be spaced apart from each other on the same layer. The connection electrode CE may be formed on the same layer as the first anode electrode AE1 and the second anode electrode AE2 to connect the first anode electrode AE1 with the second anode electrode AE2. The first anode electrode AE1, the second anode electrode AE2 and the connection electrode CE may be formed in a single body.

The connection electrode CE may include a first connection portion CE1, a second connection portion CE2, a third connection portion CE3 and a fourth connection portion CE4. The first connection portion CE1 may be extended from the first anode electrode AE1 toward the transmissive area TA as much as a predetermined (or selected) length, and the second connection portion CE2 may be extended from the second anode electrode AE2 toward the transmissive area TA as much as a predetermined (or selected) length. The third connection portion CE3 may connect the first connection portion CE1 with the second connection portion CE2. The fourth connection portion CE4 may be extended from the third connection portion CE3, and may electrically be connected with the source electrode SE or the drain electrode DE of the driving transistor TR1 through a contact hole. Although FIG. 7 shows that the connection electrode CE includes the fourth connection portion CE4, the present disclosure is not limited the example of FIG. 5. The fourth connection portion CE4 may be omitted from the connection electrode CE. In this case, the third connection portion CE3 may electrically be connected with the source electrode SE or the drain electrode DE of the driving transistor TR1 through a contact hole.

In the transparent display panel 110 according to one embodiment of the present disclosure, when any one of the first anode electrode AE1 and the second anode electrode AE2 operates in error due to particles that may occur during a process, at least one of the first connection portion CE1, the second connection portion CE2, the third connection portion CE3 or the fourth connection portion CE4 of the connection electrode CE may be subjected to short-circuit for repair. Also, the transparent display panel 110 according to one embodiment of the present disclosure may repair the anode electrode subjected to short-circuit by connecting the corresponding anode electrode to an anode electrode of another subpixel adjacent thereto by using a repair line (not shown).

Although FIG. 7 shows that the first electrode 120 includes the first anode electrode AE1, the second anode electrode AE2 and the connection electrode CE, the present disclosure is not limited to the example of FIG. 7. The first electrode 120 may be comprised of one anode electrode.

The first electrode 120 may be made of a metal material of high reflectance such as a deposited structure (Ti/Al/Ti) of Al and Ti, a deposited structure (ITO/Al/ITO) of Al and ITO, Ag alloy, and a deposited structure (ITO/Ag alloy/ITO) of Ag alloy and ITO. The Ag alloy may be an alloy of Ag, Pd and Cu. The first electrode 120 may be an anode electrode.

The bank 125 may be provided over the planarization film PLN. Also, the bank 125 may be formed to cover or at least partially cover the edge of the first electrode 120 and partially expose the first electrode 120. In detail, the bank 125 may be formed to cover or at least partially cover the edge of each of the first anode electrode AE1 and the second anode electrode AE2 and expose a portion of each of the first anode electrode AE1 and the second anode electrode AE2. Therefore, the bank 125 may prevent emission efficiency from being deteriorated due to concentration of a current on the ends of the first anode electrode AE1 and the second anode electrode AE2.

The bank 125 may define emission areas EA1, EA2, EA3 and EA4 of the subpixels SP1, SP2, SP3 and SP4, respectively. The emission areas EA1, EA2, EA3 and EA4 of the subpixels SP1, SP2, SP3 and SP4 denote areas where the first electrode 120, the organic light emitting layer 130 and the second electrode 140 are sequentially deposited and then holes from the first electrode 120 and electrons from the second electrode 140 are combined with each other in the organic light emitting layer 130 to emit light. In this case, since the area where the bank 125 is provided does not emit light, the area may become the non-emission area NEA, and the area where the bank 125 is not provided and the first electrode 120 is exposed may become the emission area EA.

The bank 125 may be formed of an organic film such as acryl resin, epoxy resin, phenolic resin, polyamide resin, and polyimide resin.

The organic light emitting layer 130 may be provided over the first electrode 120. The organic light emitting layer 130 may include a hole transporting layer, a light emitting layer, and an electron transporting layer. In this case, when a voltage is applied to the first electrode 120 and the second electrode 140, the holes and the electrons move to the light emitting layer through the hole transporting layer and the electron transporting layer, respectively, and are combined with each other in the light emitting layer to emit light.

In one embodiment, the organic light emitting layer 130 may be a common layer commonly provided in the subpixels SP1, SP2, SP3 and SP4. At this time, the light emitting layer 130 may be a white light emitting layer for emitting white light.

In another embodiment, the organic light emitting layer 130 may include light emitting layers respectively provided for the subpixels SP1, SP2, SP3 and SP4 as shown in FIG. 8. For example, a green light emitting layer for emitting green light may be provided in the first subpixel SP1, a red light emitting layer for emitting red light may be provided in the second subpixel SP2, a blue light emitting layer for emitting blue light may be provided in the third subpixel SP3, and a white light emitting layer for emitting white light may be provided in the fourth subpixel SP4. In this case, the light emitting layers of the organic light emitting layer 130 are not provided in the transmissive area TA.

The second electrode 140 may be provided over the organic light emitting layer 130 and the bank 125. The second electrode 140 may be provided in the transmissive area TA as well as the non-transmissive area NTA including the emission area EA, but is not limited thereto. The second electrode 140 is only provided in the non-transmissive area NTA including the emission area EA, but may not be provided in the transmissive area TA to improve transmittance.

The second electrode 140 may be a common layer commonly provided for the subpixels SP1, SP2, SP3 and SP4 to apply the same voltage to the subpixels. The second electrode 140 may be formed of a transparent conductive material (TCO) such as ITO and IZO, which can transmit light, or may be formed of a semi-transmissive conductive material such as Mg, Ag, or alloy of Mg and Ag. When the second electrode 140 is formed of a semi-transmissive conductive material, emission efficiency may be enhanced by micro cavity. The second electrode 140 may be a cathode electrode.

An encapsulation film 150 may be provided over the light emitting diodes. The encapsulation film 150 may be provided over the second electrode 140 to overlay the second electrode 140. The encapsulation film 150 serves to prevent oxygen or moisture from being permeated into the organic light emitting layer 130 and the second electrode 140. Accordingly, in some embodiments, the encapsulation film 150 may include at least one inorganic film and at least one organic film.

Meanwhile, although not shown in FIG. 8, a capping layer may additionally be provided between the second electrode 140 and the encapsulation film 150.

A color filter layer 170 may be provided over the encapsulation film 150. The color filter layer 170 may be provided over one surface of a second substrate 112 that faces the first substrate 111. In this case, the first substrate 111 provided with the encapsulation film 150 and the second substrate 112 provided with the color filter layer 170 may be bonded to each other by a separate adhesive layer 160. At this time, the adhesive layer 160 may be an optically clear resin (OCR) layer or an optically clear adhesive (OCA) film.

The color filter layer 170 may be provided to be patterned for each of the subpixels P1, P2 and P3. In detail, the color filter layer 170 may include a first color filter CF1, a second color filter CF2, and a third color filter CF3. The first color filter CF1 may be disposed to correspond to the emission area EA1 of the first subpixel SP1, and may be a green color filter that transmits green light. The second color filter CF2 may be disposed to correspond to the emission area EA2 of the second subpixel SP2, and may be a red color filter that transmits red light. The third color filter CF3 may be disposed to correspond to the emission area EA3 of the third subpixel SP3, and may be a blue color filter that transmits blue light.

In the transparent display panel 110 according to one embodiment of the present disclosure, a polarizer is not used, and the color filter layer 170 is provided over the second substrate 112. When the polarizer is attached to the transparent display panel 110, transmittance of the transparent display panel 110 is reduced by the polarizer. When the polarizer is not attached to the transparent display panel 110, a problem occurs in that externally incident light is reflected in the electrodes.

The transparent display panel 110 according to one embodiment of the present disclosure may prevent transmittance from being reduced as a polarizer is not attached thereto. Also, in the transparent display panel 110 according to one embodiment of the present disclosure, the color filter layer 170 may be provided over the second substrate 112 to partially absorb externally incident light, thereby preventing the incident light from being reflected in the electrodes. That is, the transparent display panel 110 according to one embodiment of the present disclosure may reduce external light reflectance without reducing transmittance.

Meanwhile, a black matrix BM may be provided among the color filters CF. The black matrix BM may be provided among the subpixels SP1, SP2, SP3 and SP4 to prevent color mixture from occurring among the subpixels SP1, SP2, SP3 and SP4 adjacent to one another. Also, the black matrix BM may prevent externally incident light from being reflected in a plurality of lines provided among the subpixels SP1, SP2, SP3 and SP4, for example, gate lines, data lines, pixel power lines, common power lines, reference lines, etc.

The black matrix BM, as described with reference to FIG. 3, may include a first black matrix BM1 provided among the plurality of subpixels SP1, SP2, SP3 and SP4, and a second black matrix BM2 provided between each of the plurality of subpixels SP1, SP2, SP3 and SP4 and the transmissive area TA.

In one embodiment, the second black matrix BM2 may not be provided between the fourth subpixel SP4 and the transmissive area TA. Since the white light emitted from the fourth subpixel SP4 is not varied depending on a viewing angle, the transparent display panel 110 according to one embodiment of the present disclosure may improve transmittance and reduce light loss caused by the second black matrix BM2 as the second black matrix BM2 is not provided between the fourth subpixel SP4 and the transmissive area TA.

In one embodiment, the second black matrix BM2 may be provided with an opening area OA for exposing the connection electrode CE of the first electrode 120 provided in each of the plurality of subpixels SP1, SP2, SP3 and SP4. Laser may be irradiated to the connection electrode CE of the first electrode 120 during a repair process. For laser irradiation to an exact position, it is beneficial for the connection electrode CE of the first electrode 120 to be exposed without being overlaid by the second black matrix BM2.

The aforementioned black matrix BM may include a material that absorbs light, for example, a black dye that fully absorbs light of a visible light wavelength range.

The color filter layer 170 may define the non-transmissive area NTA in the display area DA. In detail, an area provided with the color filters CF and the black matrix BM may become the non-transmissive area NTA, and the other area may become the transmissive area TA.

Figure 9:
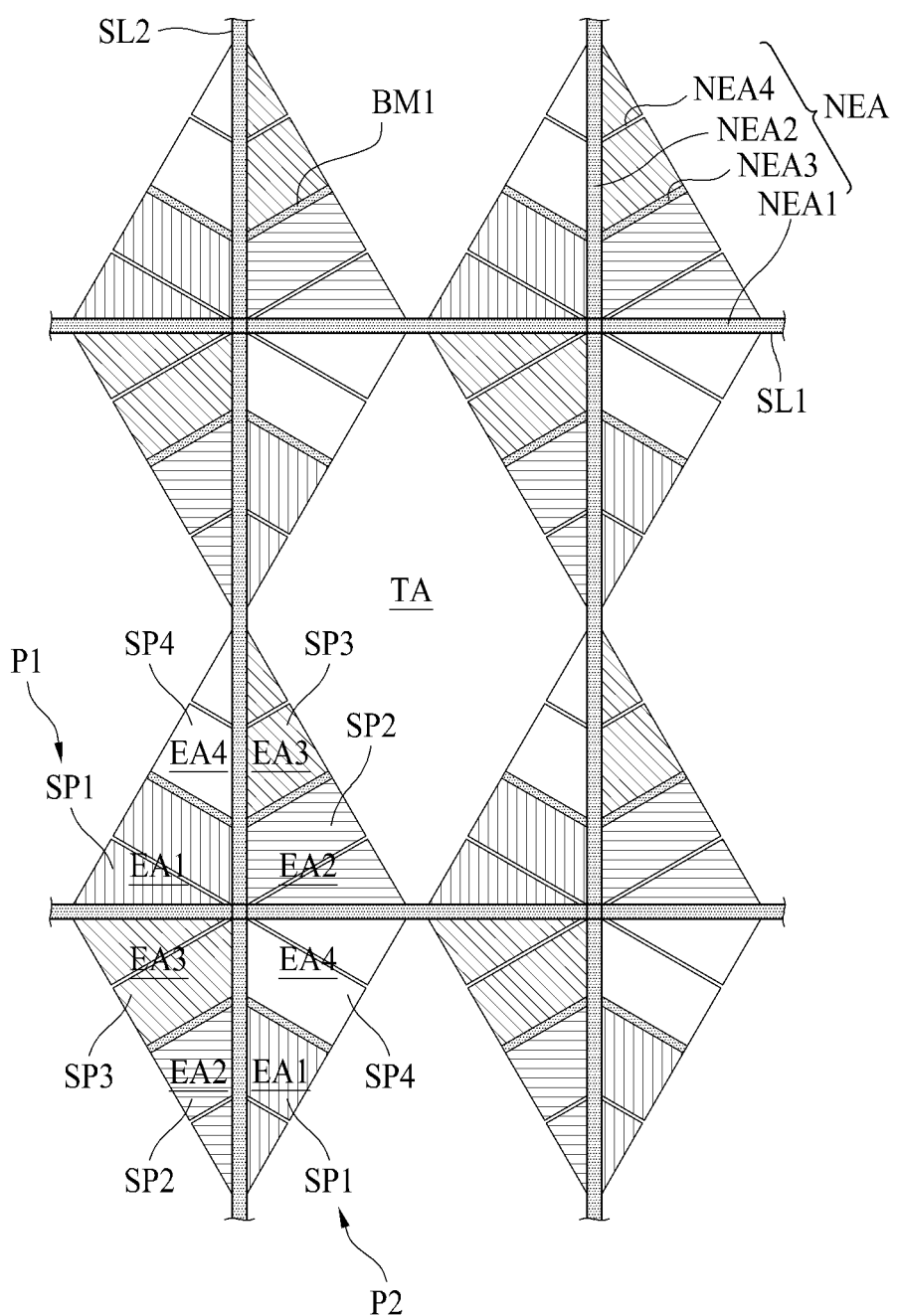
FIG. 9 is a schematic view illustrating another embodiment of a pixel provided in an area A of FIG. 2.

FIG. 9 is a schematic view illustrating another embodiment of a pixel provided in an area A of FIG. 2.

The pixel shown in FIG. 9 is substantially the same as that shown in FIG. 3 except the black matrix BM. Hereinafter, a description of the pixel shown in FIG. 7 will be given based on a difference from the pixel shown in FIG. 3, and a detailed description of elements except the black matrix BM will be omitted.

The transparent display panel 110 is categorized into a display area DA provided with pixels P to display an image, and a non-display area NDA for not displaying an image. The display area DA includes a transmissive area TA and a non-transmissive area NTA.

The non-transmissive area NTA may be provided with a first signal line SL1 extended in a first direction (X-axis direction), a second signal line SL2 extended in a second direction (Y-axis direction), and first and second pixels P1 and P2 provided in an overlapping area IA where the first signal line SL1 and the second signal line SL2 cross each other.

The non-transmissive area NTA may include an emission area EA and a non-emission area NEA.

The emission area EA may be provided with a plurality of subpixels SP1, SP2, SP3 and SP4 to emit light of a predetermined (or selected) color, and may include a first emission area EA1, a second emission area EA2, a third emission area EA3, and a fourth emission area EA4, which are respectively provided in the plurality of subpixels SP1, SP2, SP3 and SP4.

The non-emission area NEA may not emit light, and may include a first non-emission area NEA1, a second non-emission area NEA2 and a third non-emission area NEA3. In one embodiment, the non-emission area NEA may further include a fourth non-emission area NEA4.

The non-emission area NEA may be provided with a black matrix BM among the plurality of subpixels SP1, SP2, SP3 and SP4. Since the black matrix BM is made of a material that shields or absorbs light, the black matrix BM may greatly affect transmittance of the transparent display panel 110. In detail, transmittance of the transparent display panel 110 may be reduced as the area where the black matrix BM is provided, that is, the non-emission area NEA is increased. On the other hand, transmittance of the transparent display panel 110 may be increased as the non-emission area NEA is reduced.

The transparent display panel 110 according to another embodiment of the present disclosure is not provided with a second black matrix BM2 as compared with the transparent display panel 110 shown in FIG. 3, whereby the area where the black matrix BM is provided, that is, the non-emission area NEA may be reduced. Therefore, the transparent display panel 110 according to another embodiment of the present disclosure may more improve transmittance than the transparent display panel 110 shown in FIG. 3.

Figure 10:
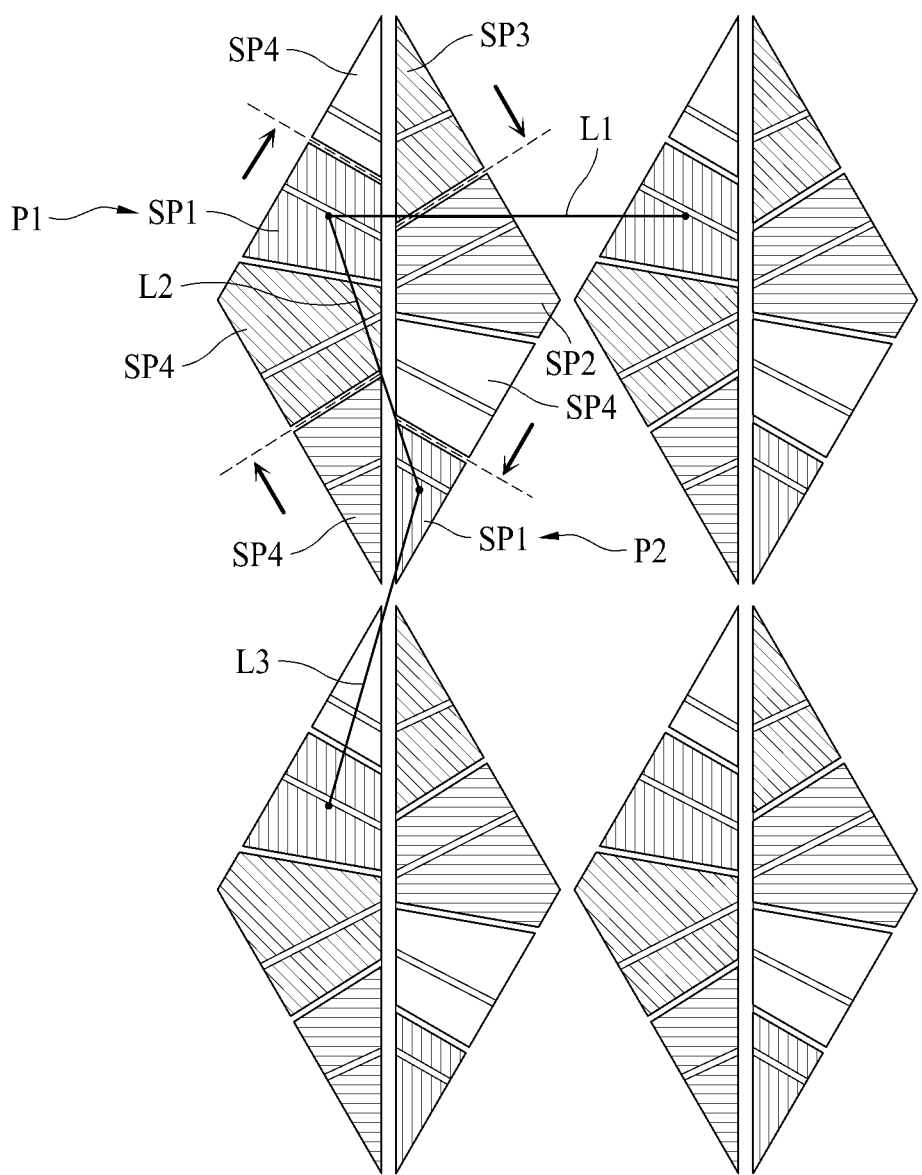
FIG. 10 is a schematic view illustrating still another embodiment of a pixel provided in an area A of FIG. 2.

FIG. 10 is a schematic view illustrating still another embodiment of a pixel provided in an area A of FIG. 2.

In the first pixel P1 and the second pixel P2, which are shown in FIG. 3, a point of the second non-emission area NEA2, from which the third non-emission area NEA3 is diverged, is uniform, but is not limited thereto. The point of the second non-emission area NEA2, from which the third non-emission area NEA3 is diverged, may be changed in various ways as shown in FIG. 10.

As described with reference to FIG. 3, the transparent display panel 110 may prevent picture quality from being deteriorated by reducing or minimizing deviation in the spaced distances among the subpixels SP1, SP2, SP3 and SP4 emitting light of the same color.

In the transparent display panel 110 according to still another embodiment of the present disclosure, the point (hereinafter, referred to as 'diverged point') of the second non-emission area NEA2, from which the third non-emission area NEA3 is diverged, may move, whereby a center point of each of the subpixels SP1, SP2, SP3 and SP4 may move. When the center point moves, the deviation in the spaced distances among the subpixels SP1, SP2, SP3 and SP4 emitting light of the same color may be varied. The third non-emission area NEA3 may be diverged from a point where deviation in the spaced distances among the subpixels SP1, SP2, SP3 and SP4 emitting light of the same color is the smallest in the second non-emission area NEA2.

For example, the diverged point from which the third non-emission area NEA3 between the first subpixel SP1 and the fourth subpixel SP4 of the first pixel P1 is diverged may move above the third non-emission area NEA3 of the first pixel P1 shown in FIG. 3. On the other hand, the diverted point from which the third non-emission area NEA3 between the second subpixel SP2 and the third subpixel SP3 of the first pixel P1 is diverged may move below the third non-emission area NEA3 of the first pixel P1 shown in FIG. 3.

Also, the diverged point from which the third non-emission area NEA3 between the first subpixel SP1 and the fourth subpixel SP4 of the second pixel P2 is diverged may move below the third non-emission area NEA3 of the first pixel P1 shown in FIG. 3. On the other hand, the diverged point from which the third non-emission area NEA3 between the second subpixel SP2 and the third subpixel SP3 of the second pixel P2 is diverged may move above the third non-emission area NEA3 of the first pixel P1 shown in FIG. 3.

In the transparent display panel 110 provided with the first pixel P1 and the second pixel P2 as shown in FIG. 10, deviation in the spaced distances among the subpixels SP1, SP2, SP3 and SP4 emitting light of the same color may be reduced as compared with the transparent display panel 110 provided with the first pixel P1 and the second pixel P2 as shown in FIG. 3. In detail, in the transparent display panel 110 provided with the first pixel P1 and the second pixel P2 as shown in FIG. 10, deviation in the first spaced distance L1 in the first direction of the subpixels SP1, SP2, SP3 and SP4 emitting light of the same color and the second spaced distances L2 and L3 in the second direction thereof may be reduced.

Figure 11:
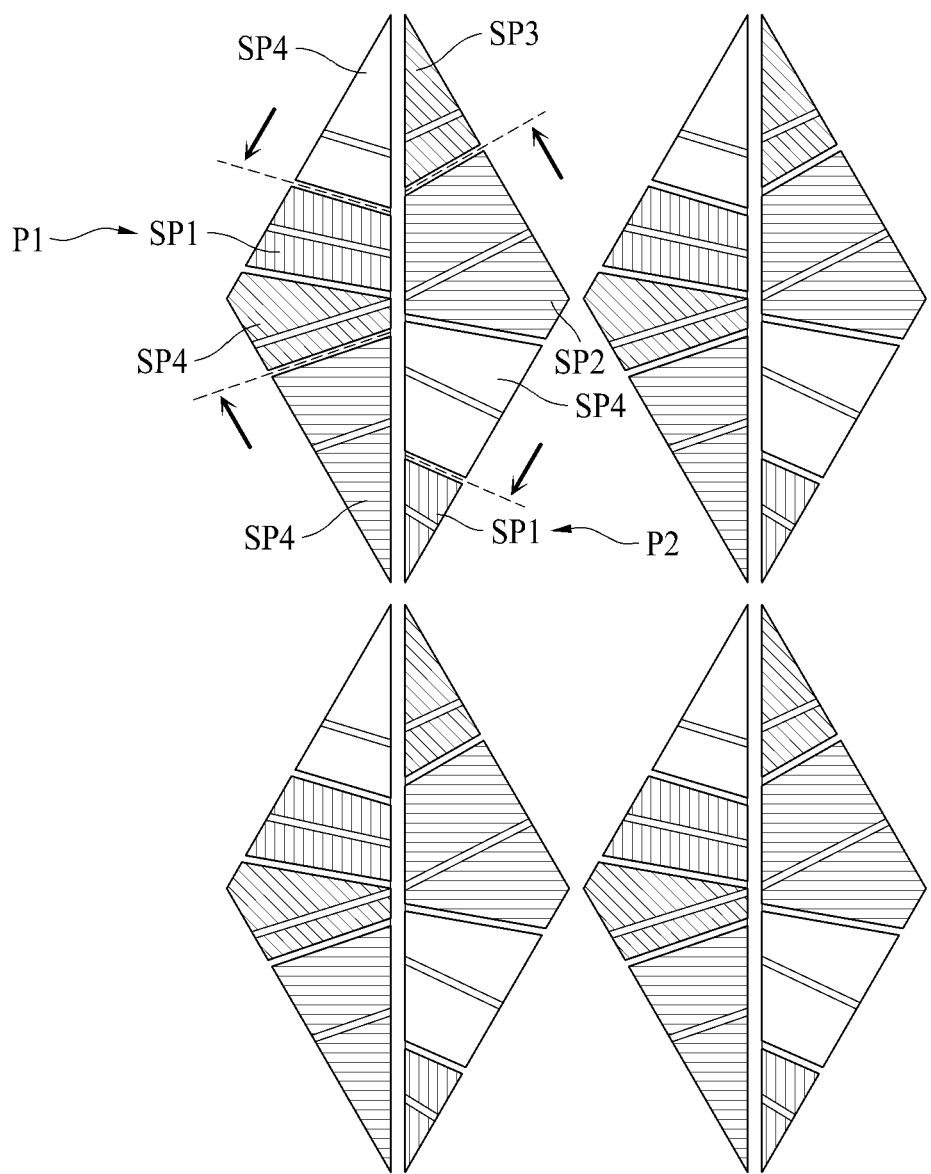
FIG. 11 is a schematic view illustrating further still another embodiment of a pixel provided in an area A of FIG. 2.

FIG. 11 is a schematic view illustrating further still another embodiment of a pixel provided in an area A of FIG. 2.

Although FIG. 10 shows that the subpixels SP1, SP2, SP3 and SP4 included in the first pixel P1 and the second pixel P2 have the same area ratio, the present disclosure is not limited to the example of FIG. 10.

An area ratio may be changed in various ways depending on product design, as shown in FIG. 11, in the subpixels SP1, SP2, SP3 and SP4 included in the first pixel P1 and the second pixel P2.

In the transparent display panel 110 according to further still another embodiment of the present disclosure, the point (hereinafter, referred to as 'diverged point') of the second non-emission area NEA2, from which the third non-emission area NEA3 is diverged, may move, whereby areas of the subpixels SP1, SP2, SP3 and SP4 may be changed.

For example, the diverged point from which the third non-emission area NEA3 between the first subpixel SP1 and the fourth subpixel SP4 of the first pixel P1 is diverged may move below the third non-emission area NEA3 of the first pixel P1 shown in FIG. 3. On the other hand, the diverted point from which the third non-emission area NEA3 between the second subpixel SP2 and the third subpixel SP3 of the first pixel P1 is diverged may move above the third non-emission area NEA3 of the first pixel P1 shown in FIG. 10.

Also, the diverged point from which the third non-emission area NEA3 between the first subpixel SP1 and the fourth subpixel SP4 of the second pixel P2 is diverged may move below the third non-emission area NEA3 of the first pixel P1 shown in FIG. 3. On the other hand, the diverged point from which the third non-emission area NEA3 between the second subpixel SP2 and the third subpixel SP3 of the second pixel P2 is diverged may move above the third non-emission area NEA3 of the first pixel P1 shown in FIG. 10.

Therefore, the areas of the first subpixel SP1 and the third subpixel SP3 respectively provided in the first pixel P1 and the second pixel P2 may be reduced, whereas the areas of the second subpixel SP2 and the fourth subpixel SP4 respectively provided in the first pixel P1 and the second pixel P2 may be increased.

In the transparent display panel 110 according to further still another embodiment of the present disclosure, the point of the second non-emission area NEA2 from which the third non-emission area NEA3 is diverged may be changed, whereby the area ratio of the subpixels SP1, SP2, SP3 and SP4 may freely be embodied without loss of the transmissive area TA.

According to the present disclosure, two pixels may correspond to one transmissive area. Therefore, the total size of the transmissive area may be increased, and transmittance may be improved.

Also, according to the present disclosure, two pixels may be provided to have triangular shapes symmetrical with each other, whereby the outer length of the transmissive area may be reduced. Moreover, according to the present disclosure, an edge angle of a pixel may be formed at about 60°, whereby the outer length of the transmissive area may be reduced. Therefore, according to the present disclosure, the area where the black matrix is provided, that is, the non-emission area may be reduced, and transmittance may be improved.

Also, according to the present disclosure, the plurality of subpixels are together disposed based on the overlapping area where the first signal line and the second signal line cross each other, whereby definition of picture quality and readability may be improved.

Also, according to the present disclosure, the first circuit area provided with at least one transistor and the second circuit area provided with a capacitor may be disposed so as not to overlap the signal lines. Therefore, according to the present disclosure, a parasitic cap may be prevented from occurring among the transistor, the capacitor and the signal lines.

Also, according to the present disclosure, the first circuit area may be disposed to be adjacent to the overlapping area, whereby a length of a connection line for connecting the transistor with the signal line may be reduced or minimized. Therefore, according to the present disclosure, loss of a voltage, which is transferred from the signal line, due to resistance may be reduced.

Also, according to the present disclosure, the capacitor may be disposed between the first circuit area and the transmissive area, and may be provided to have a maximum wide area in an area except the first circuit area and the signal lines. Therefore, according to the present disclosure, it is possible to make sure of maximum capacity of the capacitor, whereby luminance may be improved.

Also, according to the present disclosure, a shape of the transmissive area may be determined by a shape of a side of the capacitor oriented toward the transmissive area. Therefore, according to the present disclosure, a degree of freedom in design of the transmissive area may be acquired without loss of transmittance.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
a plurality of first signal lines extended in a first direction and disposed to be spaced apart from one another;
a plurality of second signal lines extended in a second direction and disposed to be spaced apart from one another, the second direction transverse to the first direction;
a transmissive area provided between two first signal lines adjacent to each other and two second signal lines adjacent to each other; and
a first pixel and a second pixel disposed based on an overlapping area where the first signal line and the second signal line cross each other,
wherein the first pixel has a triangular shape, and the second pixel has a triangular shape symmetrical with the first pixel by interposing one of the first signal line or the second signal line, and
wherein each of the first pixel and the second pixel includes a first subpixel emitting light of a first color, a second subpixel emitting light of a second color, a third subpixel emitting light of a third color, and a fourth subpixel emitting light of a fourth color.

2. The transparent display device of claim 1, wherein each of the first pixel and the second pixel includes a first side parallel with the first signal line, and second and third sides oriented toward the transmissive area, and each of the second and third sides forms 60° with the first side.

3. The transparent display device of claim 1, further comprising a first non-emission area provided along the first signal line, wherein the first subpixel, the second subpixel, the third subpixel and the fourth subpixel, which emit light of respective colors different from one another, are disposed at one side of the first non-emission area, and the first subpixel, the second subpixel, the third subpixel and the fourth subpixel, which emit light of respective colors different from one another, are disposed at the other side of the first non-emission area.

4. The transparent display device of claim 3, wherein the first subpixel, the second subpixel, the third subpixel and the fourth subpixel of the first pixel are disposed at one side of the first non-emission area, and the first subpixel, the second subpixel, the third subpixel and the fourth subpixel of the second pixel are disposed at the other side of the first non-emission area.

5. The transparent display device of claim 1, further comprising a second non-emission area provided along the second signal line, wherein the first subpixel, the second subpixel, the third subpixel and the fourth subpixel, which emit light of respective colors different from one another, are disposed at one side of the second non-emission area, and the first subpixel, the second subpixel, the third subpixel and the fourth subpixel, which emit light of respective colors different from one another, are disposed at the other side of the second non-emission area.

6. The transparent display device of claim 5, wherein the first subpixel and the second subpixel of the first pixel and the third subpixel and the fourth subpixel of the second pixel are disposed at one side of the second non-emission area, and the third subpixel and the fourth subpixel of the first pixel and the first subpixel and the second subpixel of the second pixel are disposed at the other side of the second non-emission area.

7. The transparent display device of claim 5, further comprising a third non-emission area provided between the subpixels disposed at one side of the second non-emission area and between the subpixels disposed at the other side of the second non-emission area, wherein the third non-emission area is diverged from the second non-emission area and extended toward the transmissive area, and the third non-emission area is inclined with respect to the first signal line.

8. The transparent display device of claim 7, wherein the third non-emission area forms 30° with the first signal line.

9. The transparent display device of claim 5, wherein each of the first subpixel, the second subpixel, the third subpixel and the fourth subpixel includes an emission area comprised of a first sub-emission area and a second sub-emission area.

10. The transparent display device of claim 9, further comprising a fourth non-emission area provided between the first sub-emission area and the second sub-emission area, wherein the fourth non-emission area is diverged from the second non-emission area and extended toward the transmissive area, and the fourth non-emission area is inclined with respect to the second signal line.

11. The transparent display device of claim 10, wherein the fourth non-emission area forms 30° with the second signal line.

12. The transparent display device of claim 1, wherein the first signal line includes a first gate line for supplying a gate signal to the first subpixel, the second subpixel, the third subpixel and the fourth subpixel included in the first pixel, and a second gate line for supplying a gate signal to the first subpixel, the second subpixel, the third subpixel and the fourth subpixel included in the second pixel.

13. The transparent display device of claim 1, wherein the second signal line includes at least one of a reference line, a first power line, a second power line, or a data line.

14. The transparent display device of claim 1, further comprising:
a first non-emission area provided along the first signal line;
a second non-emission area provided along the second signal line;
a third non-emission area provided between subpixels disposed at one side of the second non-emission area and between the subpixels disposed at the other side of the second non-emission area; and
a first black matrix provided in the first non-emission area, the second non-emission area and the third non-emission area.

15. The transparent display device of claim 1, further comprising a second black matrix provided between the first pixel and the transmissive area and between the second pixel and the transmissive area.

16. The transparent display device of claim 15 wherein each of the first pixel and the second pixel includes a white subpixel, and the second black matrix is provided between another subpixel except the white subpixel and the transmissive area.

17. The transparent display device of claim 1, wherein each of the first pixel and the second pixel includes a first circuit area provided with at least one transistor and a second circuit area provided with at least one capacitor, and each of the first circuit area and the second circuit area does not overlap each of the first signal line and the second signal line.

18. The transparent display device of claim 17 wherein the second circuit area is disposed between the first circuit area and the transmissive area.

19. A transparent display device comprising:
a plurality of first signal lines extended in a first direction and disposed to be spaced apart from one another;
a plurality of second signal lines extended in a second direction and disposed to be spaced apart from one another, the second direction transverse to the first direction;
a transmissive area provided between two first signal lines adjacent to each other and two second signal lines adjacent to each other;
a first pixel and a second pixel disposed based on an overlapping area where the first signal line and the second signal line cross each other, and disposed to be symmetrical with each other by interposing one of the first signal line or the second signal line; and
a first non-emission area provided along the first signal line,
wherein each of the first pixel and the second pixel includes a first subpixel emitting light of a first color, a second subpixel emitting light of a second color, a third subpixel emitting light of a third color, and a fourth subpixel emitting light of a fourth color,
wherein the first subpixel, the second subpixel, the third subpixel and the fourth subpixel in the first pixel are disposed at one side of the first non-emission area, and the first subpixel, the second subpixel, the third subpixel and the fourth subpixel in the second pixel are disposed at the other side of the first non-emission area, and
wherein the first pixel has a triangular shape, and the second pixel has a triangular shape symmetrical with the first pixel by interposing the second signal line.

20. The transparent display device of claim 19, wherein the first pixel and the second pixel correspond to one transmissive area.

21. The transparent display device of claim 19, wherein first spaced distances in the first direction are uniform in subpixels emitting light of the same color.

22. The transparent display device of claim 19, wherein a difference between a first spaced distance in the first direction and a second spaced distance in the second direction is less than 10% of the first spaced distance in subpixels emitting light of the same color.

23. The transparent display device of claim 19, wherein the first pixel and the second pixel are different from each other in at least one of a shape or an emission area of each of subpixels emitting light of the same color.

24. The transparent display device of claim 19, wherein the first signal line includes a first gate line for supplying a gate signal to the plurality of subpixels included in the first pixel, and a second gate line for supplying gate signal to the plurality of subpixels included in the second pixel.

\* \* \* \* \*